United States Patent
Nabeya et al.

(10) Patent No.: US 12,183,642 B2
(45) Date of Patent: Dec. 31, 2024

(54) FILM-THICKNESS MEASURING METHOD, METHOD OF DETECTING NOTCH PORTION, AND POLISHING APPARATUS

(71) Applicant: EBARA CORPORATION, Tokyo (JP)

(72) Inventors: Osamu Nabeya, Tokyo (JP); Shingo Togashi, Tokyo (JP); Keisuke Namiki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 151 days.

(21) Appl. No.: 17/694,125

(22) Filed: Mar. 14, 2022

(65) Prior Publication Data

US 2022/0344221 A1    Oct. 27, 2022

(30) Foreign Application Priority Data

Mar. 17, 2021 (JP) ................................. 2021-043328

(51) Int. Cl.
  *H01L 21/304* (2006.01)
  *H01L 21/66* (2006.01)
  *H01L 21/67* (2006.01)
  *H01L 21/687* (2006.01)

(52) U.S. Cl.
  CPC ............ *H01L 22/26* (2013.01); *H01L 21/304* (2013.01); *H01L 21/67219* (2013.01); *H01L 21/68764* (2013.01)

(58) Field of Classification Search
  None
  See application file for complete search history.

(56) References Cited

U.S. PATENT DOCUMENTS

| | | | | |
|---|---|---|---|---|
| 6,004,187 A | * | 12/1999 | Nyui | ....................... H01L 22/26 451/6 |
| 2006/0199479 A1 | * | 9/2006 | Togawa | .................. B24B 37/30 451/59 |
| 2012/0164917 A1 | | 6/2012 | Kobata et al. | |
| 2015/0017887 A1 | * | 1/2015 | Kobayashi | ............ B24B 37/013 451/73 |
| 2018/0001437 A1 | * | 1/2018 | Nakamura | ............ B24B 37/005 |
| 2019/0134774 A1 | | 1/2019 | Hassanein et al. | |
| 2020/0130131 A1 | | 4/2020 | Togawa et al. | |

FOREIGN PATENT DOCUMENTS

| | | |
|---|---|---|
| JP | 2003-168663 A | 6/2003 |
| JP | 2005-205594 | 8/2005 |
| JP | 2015-020242 A | 2/2015 |
| JP | 2015-193068 | 11/2015 |
| JP | 2015-217445 | 12/2015 |
| JP | 2018-183820 A | 11/2018 |
| JP | 2019-084614 A | 6/2019 |
| JP | 2020-104201 | 7/2020 |
| JP | 2012-138442 | 7/2021 |

* cited by examiner

*Primary Examiner* — Shamim Ahmed
(74) *Attorney, Agent, or Firm* — BakerHostetler

(57) ABSTRACT

A polishing method capable of accurately determining a polishing end point of a substrate is disclosed. The method is a film-thickness measuring method for a substrate W using a film-thickness measuring device, at least a part of which being mounted in a polishing table configured to support the polishing pad. The method includes measuring film thicknesses of the substrate W, while rotating the substrate W on a polishing surface of the polishing pad by a polishing head and controlling a position of the film-thickness measuring device relative to the polishing head.

10 Claims, 16 Drawing Sheets

FILM-THICKNESS MEASURING METHOD, METHOD OF DETECTING NOTCH PORTION, AND POLISHING APPARATUS

CROSS REFERENCE TO RELATED APPLICATION

This document claims priority to Japanese Patent Application No. 2021-043328 filed Mar. 17, 2021, the entire contents of which are hereby incorporated by reference.

BACKGROUND

With a recent trend toward higher integration and higher density in semiconductor devices, circuit interconnects become finer and finer and the number of levels in multilayer interconnect is increasing. In the process of achieving the multilayer interconnect structure with finer interconnects, film coverage of step geometry (or step coverage) is lowered through thin film formation as the number of interconnect levels increases, because surface steps grow while following surface irregularities on a lower layer. Therefore, in order to fabricate the multilayer interconnect structure, it is necessary to improve the step coverage and planarize the surface in an appropriate process.

Accordingly, in a manufacturing process of the semiconductor devices, a planarization technique for a surface of the semiconductor device is becoming more important. The most important technique in this surface planarization is chemical mechanical polishing (CMP). This chemical mechanical polishing (which will be hereinafter called CMP) is a process of polishing a substrate, such as a wafer, by placing the substrate in sliding contact with a polishing surface of a polishing pad while supplying a polishing liquid (slurry) containing abrasive grains, such as silica ($SiO_2$), onto the polishing surface.

A polishing apparatus for performing CMP includes a polishing table that supports a polishing pad having a polishing surface, and a polishing head for holding a substrate. Such a polishing apparatus is configured to move the polishing table and the polishing head relative to each other, and to press the substrate against the polishing surface of the polishing pad by the polishing head while supplying a polishing liquid, such as a slurry, onto the polishing surface of the polishing pad. The surface of the substrate is in sliding contact with the polishing surface in the presence of the polishing liquid, and the surface of the substrate is polished to a planar and mirrored surface by a chemical action of the polishing liquid and a mechanical action of abrasive grains contained in the polishing liquid.

Normally, a substrate, such as a wafer, is required to have a uniform film-thickness distribution over the entire surface thereof, but the film thickness of the substrate may vary due to a pre-process of CMP and a non-uniform polishing of CMP. Causes of the variation in the film thickness in the pre-process of CMP include a planarity of the substrate and a variation in a film-forming apparatus.

When the film thickness of the substrate varies, polishing of the substrate is required to eliminate the variation. In order to eliminate the variation, it is necessary to accurately determine the film-thickness distribution of the substrate. Conventionally, there is a method of measuring a film thickness of a substrate during polishing of the substrate by a film-thickness sensor installed in a polishing table. In such a method, the film thickness is measured at a plurality of measurement points on the substrate while the film-thickness sensor traverses the substrate. Since the measurement points depend on a rotation speed of the substrate, an installation position of the film-thickness sensor, a polishing time, etc., the film-thickness measurement may not be accurately performed.

There is another method of measuring a film-thickness distribution of a substrate by a film-thickness measuring device installed separately from the polishing apparatus. When polishing of the substrate is performed to eliminate a variation of the film thickness based on the film-thickness distribution measured by such a film-thickness measuring device, it is difficult to determine a position on the substrate corresponding to a measured value of the film thickness of the substrate measured by the film-thickness measuring device during polishing.

SUMMARY

There is provided a film-thickness measuring method and a polishing apparatus capable of accurately determining a film-thickness distribution of a substrate. Further, there is provided a method of accurately detecting a position of a notch portion of a substrate in order to determine positions on the substrate corresponding to a plurality of measured values of the film thickness.

Embodiments, which will be described below, relate to a film-thickness measuring method and a polishing apparatus for measuring a film thickness of a substrate, such as a wafer. Further, embodiments, which will be described below, relate to a method of detecting a notch portion using such a film-thickness measuring method.

In one embodiment, there is provided a film-thickness measuring method for a substrate using a film-thickness measuring device, at least a part of the film-thickness measuring device being mounted to a polishing table that support a polishing pad, said method comprising: measuring film thicknesses of the substrate, while rotating the substrate on a polishing surface of the polishing pad by a polishing head and controlling a position of the film-thickness measuring device relative to the polishing head.

In one embodiment, controlling the position of the film-thickness measuring device relative to the polishing head comprises controlling, in synchronization with the polishing head, at least one of an oscillating motor that oscillates the polishing head along the polishing surface and a table motor that rotates the polishing table.

In one embodiment, during the measuring of the film thicknesses of the substrate, pressures in a plurality of pressure chambers formed by an elastic membrane of the polishing head are regulated such that the polishing head presses the substrate against the polishing surface.

In one embodiment, the pressures in the plurality of pressure chambers are regulated such that an outer portion of the substrate is pressed against the polishing surface while a central portion of the substrate is attracted.

In one embodiment, the film-thickness measuring device is an optical film-thickness measuring device or an eddy-current-type film-thickness measuring device.

In one embodiment, an area where the film thicknesses are measured is a periphery of the substrate.

In one embodiment, controlling the position of the film-thickness measuring device relative to the polishing head comprises controlling the position of the film-thickness measuring device relative to the polishing head based on a rotation angle of the polishing head such that a measuring position for the film thicknesses traces a path extending in a circumferential direction of the periphery.

In one embodiment, controlling the position of the film-thickness measuring device relative to the polishing head comprises controlling the position of the film-thickness measuring device relative to the polishing head such that a measuring position for the film thicknesses moves in a radial direction of the substrate in a plurality of regions arranged in a circumferential direction of the substrate, and the plurality of regions include at least the periphery of the substrate.

In one embodiment, controlling the position of the film-thickness measuring device relative to the polishing head comprises controlling the position of the film-thickness measuring device relative to the polishing head such that a measuring position for the film thicknesses moves in a circumferential direction of the substrate while meandering in a region including at least the periphery of the substrate.

In one embodiment, there is provided a method of detecting a notch portion, comprising: measuring film thicknesses of a periphery of a substrate by using the above-described method; and determining a position of the notch portion of the substrate based on a measurement result of the film thicknesses.

In one embodiment, there is provided a polishing method comprising: polishing a substrate while rotating the substrate on a polishing surface of a polishing pad by a polishing head; measuring a film thickness of the substrate by a film-thickness measuring device during the polishing of the substrate; stopping the polishing of the substrate; when a variation in film thickness of a periphery of the substrate is out of a reference range, measuring film thicknesses of the periphery of the substrate, while rotating the substrate on the polishing surface of the polishing pad by the polishing head and controlling a position of the film-thickness measuring device relative to the polishing head; and re-polishing the substrate such that the variation of the film thicknesses of the periphery of the substrate is eliminated.

In one embodiment, there is provided a polishing apparatus for polishing a substrate, comprising: a polishing table configured to support a polishing pad; a table motor configured to rotate the polishing table; a polishing head configured to press the substrate against a polishing surface of the polishing pad; a polishing-head rotating motor configured to rotate the polishing head; a polishing-head oscillation arm coupled to the polishing head; an oscillating motor coupled to the polishing-head oscillation arm and configured to oscillate the polishing head along the polishing surface; a film-thickness measuring device configured to measure a film thickness of the substrate, at least a part of the film-thickness measuring device being mounted to the polishing table; and an operation controller configured to control an operation of the polishing apparatus, wherein the operation controller is configured to instruct the film-thickness measuring device to measure film thicknesses of the substrate, while instructing the polishing-head rotating motor to rotate the polishing head to thereby rotate the substrate and controlling a position of the film-thickness measuring device relative to the polishing head.

In one embodiment, there is provided a polishing apparatus for polishing a substrate, comprising: a polishing table configured to support a polishing pad; a table motor configured to rotate the polishing table; a polishing head configured to press the substrate against a polishing surface of the polishing pad; a polishing-head rotating motor configured to rotate the polishing head; a polishing-head oscillation arm coupled to the polishing head; an oscillating motor coupled to the polishing-head oscillation arm and configured to oscillate the polishing head along the polishing surface; a film-thickness measuring device configured to measure a film thickness of the substrate, at least a part of the film-thickness measuring device being mounted to the polishing table; and an operation controller configured to control an operation of the polishing apparatus, wherein the operation controller is configured to: instruct the film-thickness measuring device to measure film thicknesses of a periphery of the substrate, while instructing the polishing-head rotating motor to rotate the polishing head to thereby rotate the substrate and controlling a position of the film-thickness measuring device relative to the polishing head; and determine a position of a notch portion based on a measurement result of the film thicknesses.

In one embodiment, the operation controller is configured to control the position of the film-thickness measuring device relative to the polishing head by controlling at least one of the oscillating motor and the table motor in synchronization with the polishing head.

In one embodiment, the operation controller is configured to control the position of the film-thickness measuring device relative to the polishing head based on a rotation angle of the polishing head such that a measuring position for the film thicknesses traces a path extending in a circumferential direction of a periphery of the substrate.

In one embodiment, the operation controller is configured to control the position of the film-thickness measuring device relative to the polishing head such that a measuring position for the film thicknesses moves in a radial direction of the substrate in a plurality of regions arranged in a circumferential direction of the substrate, and the plurality of regions include at least a periphery of the substrate.

In one embodiment, the operation controller is configured to control the position of the film-thickness measuring device relative to the polishing head such that a measuring position for the film thicknesses moves in a circumferential direction of the substrate while meandering in a region including at least a periphery of the substrate.

In one embodiment, the polishing head includes an elastic membrane configured to press the substrate against the polishing surface; the polishing head has a plurality of pressure chambers formed by the elastic membrane; the polishing apparatus further comprises a plurality of pressure regulators coupled to the plurality of pressure chambers, respectively; and the operation controller is configured to instruct the plurality of pressure regulators to regulate pressures in the plurality of pressure chambers such that the polishing head presses the substrate against the polishing surface during measuring of the film thicknesses of the substrate.

In one embodiment, the polishing apparatus further comprises: a plurality of gas delivery lines coupled to the plurality of pressure chambers, respectively; a vacuum line communicating with one of the plurality of gas delivery lines; and a switching valve coupled to one of the plurality of gas delivery lines, wherein the elastic membrane has a through-hole communicating with one of the plurality of pressure chambers, and the operation controller is configured to instruct the plurality of pressure regulators to regulate the pressures in the plurality of pressure chambers such that an outer portion of the substrate is pressed against the polishing surface, while instructing the switching valve to provide a fluid communication between one of the plurality of gas delivery lines and the vacuum line to attract a central portion of the substrate, during the measuring of the film thicknesses of the substrate.

In one embodiment, the film-thickness measuring device is an optical film-thickness measuring device or an eddy-current-type film-thickness measuring device.

According to the above embodiment, the film thicknesses of the substrate are measured while the position of the film-thickness measuring device relative to the polishing head are controlled. As a result, the measurement accuracy of the film thicknesses can be improved, a film-thickness distribution of the substrate can be accurately grasped, and the position of the notch portion of the substrate can be accurately detected.

DESCRIPTION OF EMBODIMENTS

Embodiments will be described below with reference to the drawings.

In this specification, a periphery of a substrate is defined as a region that includes a bevel portion located on an outermost periphery of the substrate, a top edge portion and a bottom edge portion located radially inwardly of the bevel portion, and a notch portion formed in the periphery of the substrate for determining a crystal orientation.

Figure 1:
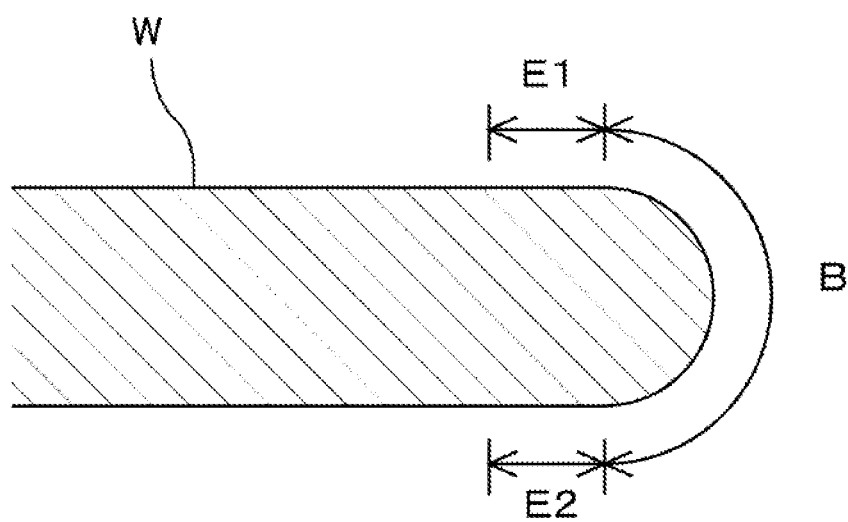
FIG. 1 is an enlarged cross-sectional view showing a periphery of a substrate.

FIG. 1 is an enlarged cross-sectional view showing a periphery of a substrate. A bevel portion is a portion (indicated by a reference symbol B) that constitutes an outermost peripheral surface of a substrate W. A top edge portion is a flat portion E1 located radially inwardly of the bevel portion B. A bottom edge portion is a flat portion E2 located at the opposite side from the top edge portion and located radially inwardly of the bevel portion B. The top edge portion E1 may include a region on which a device is formed.

Figure 2:
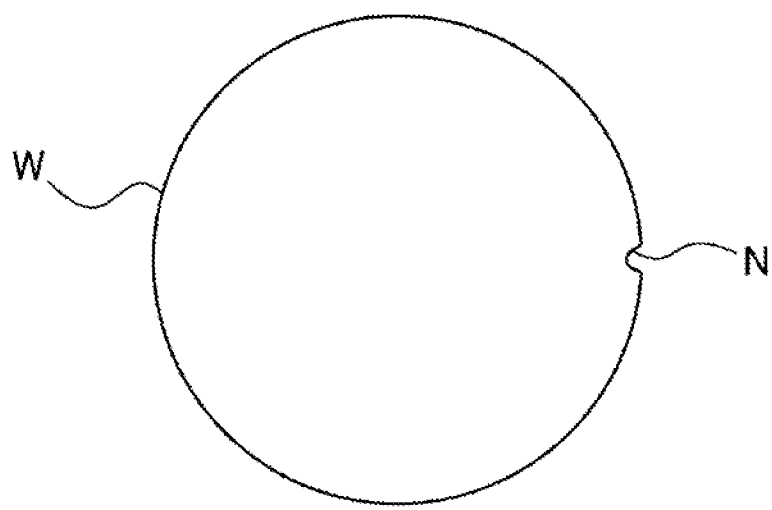
FIG. 2 is a plan view schematically showing a notch portion of the substrate.

FIG. 2 is a plan view schematically showing a notch portion of the substrate. In the substrate W of FIG. 2, the notch portion is a cut formed in the periphery indicated by a reference symbol N.

Figure 3:
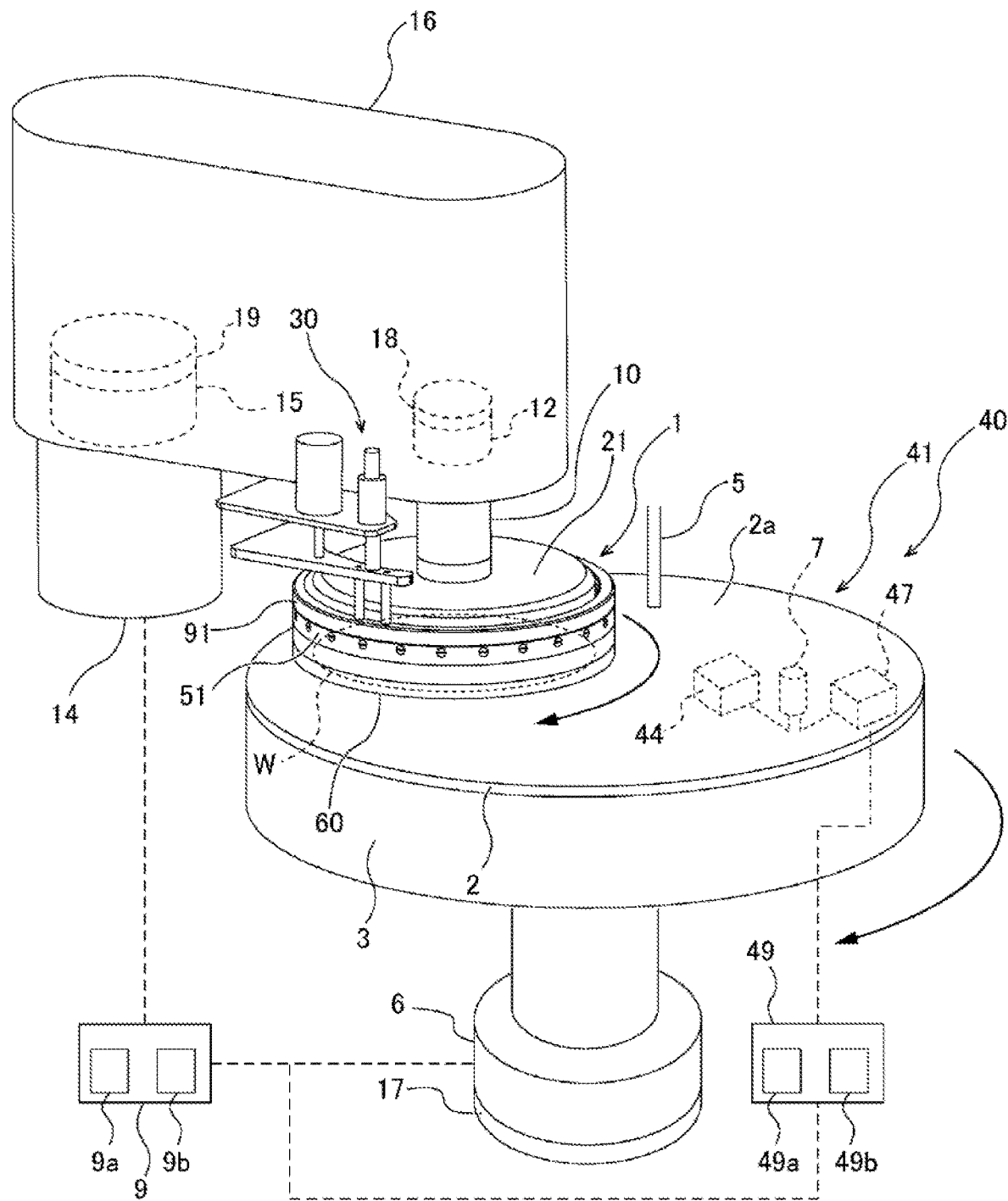
FIG. 3 is a schematic view showing an embodiment of a polishing apparatus.

FIG. 3 is a diagram showing an embodiment of a polishing apparatus. As shown in FIG. 3, the polishing apparatus includes a polishing table 3 configured to support a polishing pad 2, a table motor 6 configured to rotate the polishing table 3, and a polishing head 1 configured to press the substrate W, such as a wafer, against the polishing pad 2 and rotate the substrate W, a polishing-head rotating motor 12 configured to rotate the polishing head 1, a polishing-head oscillation arm 16 coupled to an upper end of a support shaft 14, a head shaft 10 attached to a free end of the polishing-head oscillation arm 16, a polishing-liquid supply nozzle 5 configured to supply a polishing liquid, such as a slurry, onto the polishing pad 2, a film-thickness measuring device 40 configured to measure a film thickness of the substrate W, and an operation controller 9 configured to control operations of the polishing apparatus. The polishing pad 2 has an upper surface which provides a polishing surface 2a for polishing the substrate W. The polishing-head oscillation arm 16 is arranged above the polishing table 3 and is arranged in parallel with the polishing surface 2a of the polishing pad 2.

The polishing head 1 is coupled to the head shaft 10, and the polishing-head oscillation arm 16 is coupled to the polishing head 1 through the head shaft 10. The head shaft 10 is coupled to the polishing-head rotating motor 12. The polishing-head rotating motor 12 is configured to rotate the polishing head 1 together with the head shaft 10 in a direction indicated by an arrow. The head shaft 10 is coupled to a not-shown elevating device. The polishing head 1 is raised and lowered together with the head shaft 10 by the elevating device. In the present embodiment, the polishing-head rotating motor 12 is disposed inside the polishing-head oscillation arm 16, while in one embodiment, the polishing-head rotating motor 12 may be disposed outside the polishing-head oscillation arm 16.

The polishing apparatus further includes an oscillating motor 15 which is coupled to the polishing-head oscillation arm 16 and is configured to oscillate the polishing head 1 along the polishing surface 2a. In this embodiment, the oscillating motor 15 is disposed in the support shaft 14. The polishing-head oscillation arm 16 is configured to be rotatable about the support shaft 14 by the oscillating motor 15. The polishing head 1 is moved between a not-shown receiving position for the substrate W and a position above the polishing table 3 by the pivoting motion of the polishing-head oscillation arm 16.

In one embodiment, the polishing-head oscillation arm 16 may be fixed to the support shaft 14, and the oscillating motor 15 may be coupled to the support shaft 14. The oscillating motor 15 may be configured to rotate the support shaft 14 and the polishing-head oscillation arm 16 together about a rotation axis of the support shaft 14.

The polishing table 3 is coupled to the table motor 6, which is configured to rotate the polishing table 3 and the polishing pad 2 in a direction indicated by an arrow. The rotating directions of the polishing head 1 and the polishing table 3 are not limited to this embodiment.

Hereinafter, in this specification, the table motor 6, the polishing-head rotating motor 12, and the oscillating motor 15 may be collectively referred to as motors 6, 12, and 15. The motors 6, 12, and 15 are configured to be controllable their rotation angles. An example of the motors 6, 12, and 15 includes a servomotor. An angle detector 17 configured to detect a rotation angle of the polishing table 3 is attached to the table motor 6. An angle detector 18 configured to detect a rotation angle of the polishing head 1 is attached to the polishing-head rotating motor 12. An angle detector 19 configured to detect a rotation angle of the polishing-head oscillation arm 16 (i.e., a rotation angle of the polishing head 1 around the support shaft 14) is attached to the oscillating motor 15. An example of the angle detectors 17, 18, and 19 includes a rotary encoder.

The operation controller 9 includes a memory 9a storing programs therein, and an arithmetic device 9b configured to perform arithmetic operations according to instructions contained in the programs. The arithmetic device 9b includes a CPU (central processing unit) or a GPU (graphic processing unit), etc., which is configured to perform the arithmetic operations according to the instructions contained in the programs stored in the memory 9a. The memory 9a includes a main memory (e.g., a random access memory) being accessible to the arithmetic device 9b, and an auxiliary memory (e.g., a hard disk drive or a solid state drive) configured to store data and programs. The operation controller 9 is composed of at least one computer. However, the specific configurations of the operation controller 9 are not limited to this example.

The operation controller 9 is electrically connected to the not-shown elevating device, the motors 6, 12, and 15, the angle detectors 17, 18, and 19, the film-thickness measuring device 40, and the polishing-liquid supply nozzle 5. Operations of the elevating device, the motors 6, 12, and 15, the angle detectors 17, 18, and 19, the film-thickness measuring device 40, and the polishing-liquid supply nozzle 5 are controlled by the operation controller 9.

A part of the film-thickness measuring device 40 is attached to the polishing table 3. The film-thickness measuring device 40 of the present embodiment is an optical film-thickness measuring device, which is configured to direct light to the surface of the substrate W and determine the film thickness of the substrate W based on an intensity measurement data of reflected light from the substrate W. The optical film-thickness measuring device 40 includes a film-thickness sensor 41 and a processing system 49 coupled to the film-thickness sensor 41. The film-thickness sensor 41 is attached to the polishing table 3 and rotates together with the polishing table 3 and the polishing pad 2. The film-thickness sensor 41 includes a light source 44 configured to emit light, a spectrometer 47, and an optical sensor head 7 coupled to the light source 44 and the spectrometer 47. The processing system 49 is coupled to the spectrometer 47. A position of the optical sensor head 7 is such that the optical sensor head 7 sweeps across the surface of the substrate W on the polishing pad 2 each time the polishing table 3 and the polishing pad 2 make one rotation. In one embodiment, the entire film-thickness measuring device 40 may be attached to the polishing table 3.

The processing system 49 includes a memory 49a storing programs therein, such as programs for performing a generation of a spectrum and a film-thickness detection for the substrate W, which will be described later, and an arithmetic device 49b configured to perform arithmetic operations according to instructions contained in the programs. The arithmetic device 49b includes a CPU (central processing unit) or a GPU (graphic processing unit), etc., which is configured to perform the arithmetic operations according to the instructions contained in the programs stored in the memory 9a. The memory 49a includes a main memory (e.g., a random access memory) being accessible to the arithmetic device 49b, and an auxiliary memory (e.g., a hard disk drive or a solid state drive) configured to store data and programs. The processing system 49 is composed of at least one computer. However, the specific configurations of the processing system 49 are not limited to this example.

The light emitted by the light source 44 is transmitted to the optical sensor head 7, which directs the light to the surface of the substrate W. The light is reflected off the surface of the substrate W, and the reflected light from the surface of the substrate W is received by the optical sensor head 7 and is further transmitted to the spectrometer 47. The spectrometer 47 decomposes the reflected light according to wavelength, and measures an intensity of the reflected light at each of the wavelengths. The intensity measurement data of the reflected light is transmitted to the processing system 49.

The processing system 49 is configured to produce a spectrum of the reflected light from the intensity measurement data of the reflected light. This spectrum of the reflected light is expressed as a line graph (i.e., a spectral waveform) indicating a relationship between the wavelength and the intensity of the reflected light. The intensity of the reflected light can also be represented by a relative value, such as a reflectance or a relative reflectance.

Figure 4:
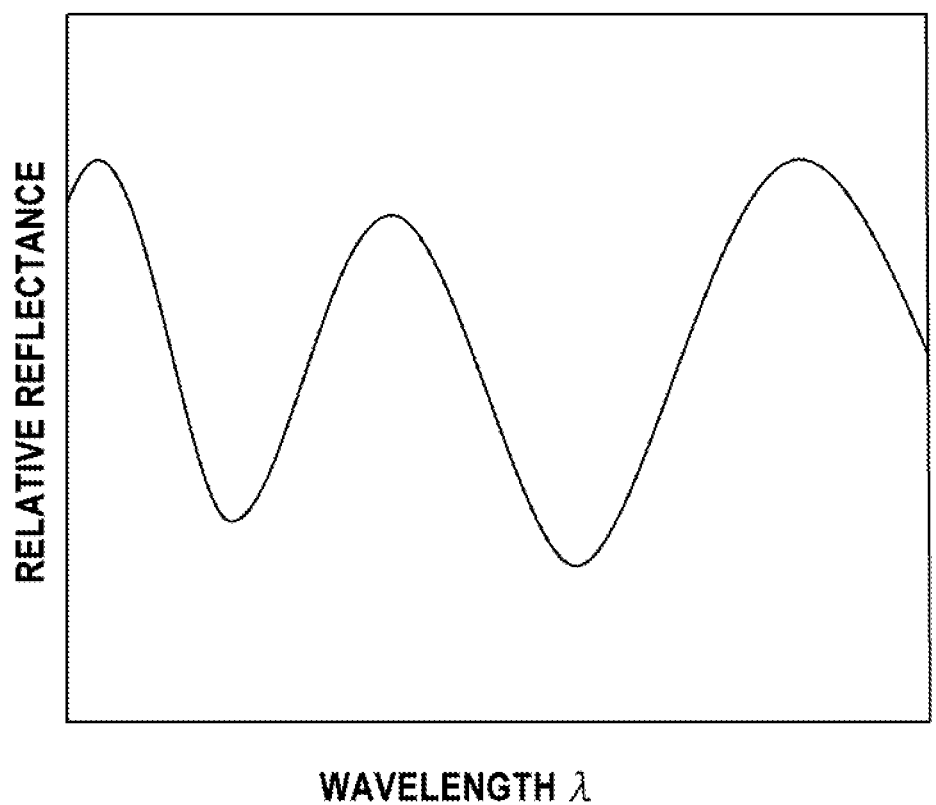
FIG. 4 is a diagram showing an example of a spectrum generated by a processing system.

FIG. 4 is a diagram showing an example of the spectrum generated by the processing system 49. This spectrum is expressed as a line graph (i.e., a spectral waveform) indicating a relationship between the wavelength and the intensity of the light. In FIG. 4, horizontal axis represents wavelength of the reflected light from the substrate, and vertical axis represents relative reflectance derived from the intensity of the reflected light. The relative reflectance is an index value that represents the intensity of the reflected light. The relative reflectance is a ratio of the intensity of the light to a predetermined reference intensity. By dividing the intensity of the light (i.e., the actually measured intensity) at each wavelength by a predetermined reference intensity, unwanted noises, such as a variation in the intensity inherent in an optical system or the light source of the apparatus, are removed from the actually measured intensity.

The reference intensity is an intensity of light measured in advance at each of the wavelengths. The relative reflectance is calculated at each of the wavelengths. Specifically, the relative reflectance is determined by dividing the intensity of the light (the actual intensity) at each wavelength by a corresponding reference intensity. The reference intensity is obtained by directly measuring the intensity of light emitted from the optical sensor head 7, or by irradiating a mirror with light from the optical sensor head 7 and measuring the intensity of reflected light from the mirror. Alternatively, the reference intensity may be an intensity of the reflected light from a silicon substrate (bare substrate) with no film thereon measured by spectrometer 47 when the silicon substrate is being water-polished on the polishing pad 2 in the presence of water, or when the silicon substrate (bare substrate) is placed on the polishing pad 2.

In the actual polishing process, a dark level (which is a background intensity obtained under a condition that a light is cut off) is subtracted from the actually measured intensity to determine a corrected actually measured intensity. Further, the dark level is subtracted from the reference intensity to determine a corrected reference intensity. Then the relative reflectance is calculated by dividing the corrected actually measured intensity by the corrected reference intensity. Specifically, the relative reflectance R(λ) can be calculated by using the following equation (1).

$$R(\lambda) = \frac{E(\lambda) - D(\lambda)}{B(\lambda) - D(\lambda)} \quad (1)$$

Here, λ, is wavelength of the reflected light from the substrate, E(λ) is the intensity at the wavelength λ, B(λ) is the reference intensity at the wavelength λ, and D(λ) is the background intensity (i.e., dark level) at the wavelength λ measured under the condition that a light is cut off.

Each time the polishing table 3 makes one rotation, the optical sensor head 7 directs the light to the surface (polishing-target surface) of the substrate W, and receives the reflected light from the substrate W. The reflected light is transmitted to the spectrometer 47. The spectrometer 47 decomposes the reflected light according to the wavelength, and measures the intensity of the reflected light at each of the wavelengths. The intensity measurement data of the reflected light is transmitted to the processing system 49, and the processing system 49 produces a spectrum as shown in FIG. 4 from the intensity measurement data of the reflected light. Further, the processing system 49 determines the film thickness of the substrate W from the spectrum of the spectrum of the reflected light. The spectrum of the reflected light varies according to the film thickness of the substrate W. Therefore, the processing system 49 can determine the film thickness of the substrate W from the spectrum of the spectrum of the reflected light. A known technique can be used as the specific method of determining the film thickness of the substrate W from the spectrum of reflected light. In the example shown in FIG. 4, the spectrum of the reflected light is a spectral waveform showing the relationship between the relative reflectance and the wavelength of the reflected light. The spectrum of the reflected light may be a spectral waveform showing a relationship between the intensity itself of the reflected light and the wavelength of the reflected light.

The processing system 49 transmits the determined film-thickness data of the substrate W to the operation controller 9. The operation controller 9 controls the polishing operation of the substrate W based on the film thickness of the substrate W. For example, the operation controller 9 instructs a pressure regulator, described later, to regulate a pressing force on the substrate W against the polishing surface 2a based on the film thickness of the substrate W.

The optical film-thickness measuring device 40 of the present embodiment is configured to measure a plurality of film thicknesses at a plurality of measurement points on the substrate W. In the present embodiment, while the optical sensor head 7 sweeps across the substrate W once, the optical sensor head 7 emits the light to the plurality of measurement points on the substrate W and receives the reflected light from the plurality of measurement points.

In the present embodiment, only one film-thickness sensor 41 is provided on the polishing table 3, but a plurality of film-thickness sensors 41 may be provided on the polishing table 3. Further, in one embodiment, a plurality of optical sensor heads 7, one light source 44 coupled to the plurality of optical sensor heads 7, and one spectrometer 47 coupled to the plurality of optical sensor heads 7 may be provided on the polishing table 3. By providing the plurality of film-thickness sensors 41 (or the plurality of optical sensor heads 7), the number of measurement points of the film thickness on the substrate W is increased, and a film-thickness profile can be obtained more accurately.

Figure 5:
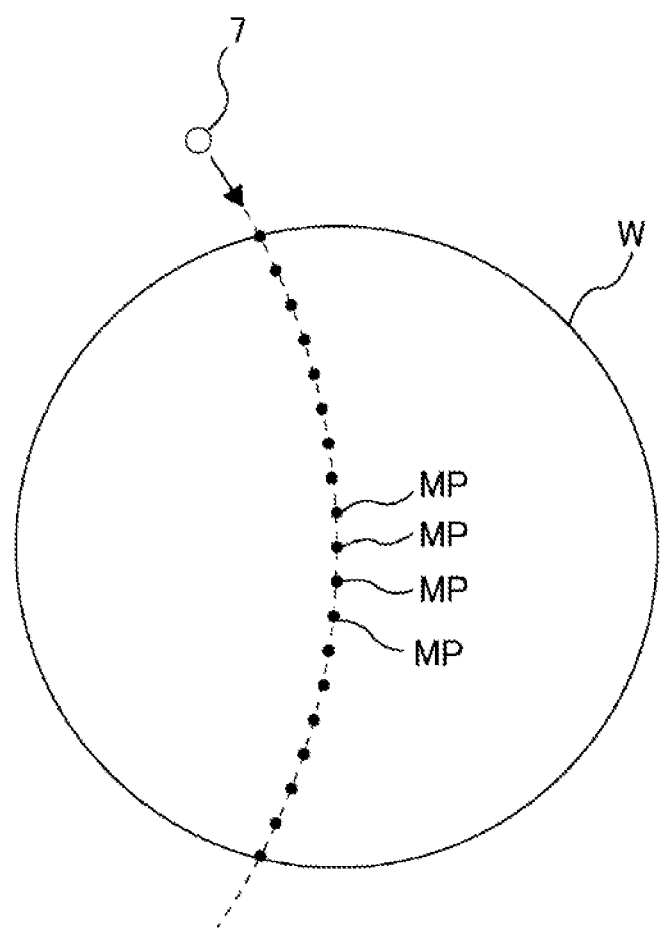
FIG. 5 is a diagram showing an example of a plurality of measurement points on a surface (polishing-target surface) of the substrate W.

FIG. 5 is a diagram showing an example of the plurality of measurement points on the surface (polishing-target surface) of the substrate W. As shown in FIG. 5, the optical sensor head 7 directs the light to the plurality of measurement points MP each time the optical sensor head 7 sweeps across the substrate W, and receives the reflected light from the plurality of measurement points MP. Therefore, each time the optical sensor head 7 sweeps across the substrate W (i.e., each time the polishing table 3 makes one rotation), the processing system 49 generates a plurality of spectra of the reflected light from the plurality of measurement points MP, and determines film thicknesses at the measurement points MP based on the plurality of spectra. A position of each measurement point MP is determined based on irradiation timing of the light, a rotation speed of the polishing table 3, a position of the polishing head 1, a rotation speed of the polishing head 1, etc.

In one embodiment, the film-thickness measuring device 40 may be an eddy-current type film-thickness measuring device, and the film-thickness sensor 41 may be an eddy-current sensor. The eddy-current sensor has a sensor coil configured to pass a magnetic flux through a conductive film of the substrate W to generate an eddy current. The eddy-current sensor detects the eddy current that varies according to the film thickness of the substrate W and outputs an eddy current signal. The eddy current signal is transmitted to the processing system 49. The processing system 49 determines a film thickness of the substrate W based on the eddy current signal. The eddy-current sensor detects the eddy current each time the polishing table 3 makes one rotation. As with the embodiment described with reference to FIG. 5, the eddy-current sensor detects eddy currents at the plurality of measurement points MP and outputs eddy current signals at the measurement points MP while the optical sensor head 7 sweeps across the substrate W once. The processing system 49 determines film thicknesses at the measurement points MP based on the plurality of eddy current signals.

The polishing head 1 includes a head body 21 configured to press the substrate W against the polishing pad 2, and a retainer ring 60 arranged so as to surround the substrate W. The head body 21 and the retainer ring 60 are configured to be rotatable together with the head shaft 10. The retainer ring 60 is configured to be movable in vertical directions independently of the head body 21. The retainer ring 60 projects radially outwardly from the head body 21. During polishing of the substrate W, the retainer ring 60 contacts the polishing surface 2a of the polishing pad 2, and presses the polishing pad 2 outside the substrate W while the retainer ring 60 is rotating.

The polishing apparatus further includes a rotary ring 51 in which a plurality of rollers (which will be discussed later) are arranged, and a stationary ring 91. The rotary ring 51 is fixed to an upper surface of the retainer ring 60, and is configured to be rotatable together with the retainer ring 60. The stationary ring 91 is located on the rotary ring 51. The rotary ring 51 rotates together with the polishing head 1, while the stationary ring 91 does not rotate and remains stationary.

The polishing apparatus further includes a local-load exerting device 30 for applying a local load to a part of the stationary ring 91. The local-load exerting device 30 is arranged above the retainer ring 60 and is fixed to the polishing-head oscillation arm 16. While the retainer ring 60 rotates about its central axis during polishing of the substrate W, the local-load exerting device 30 does not rotate together with the retainer ring 60 and remains in a stationary. The stationary ring 91 is coupled to the local-load exerting device 30.

Figure 6:
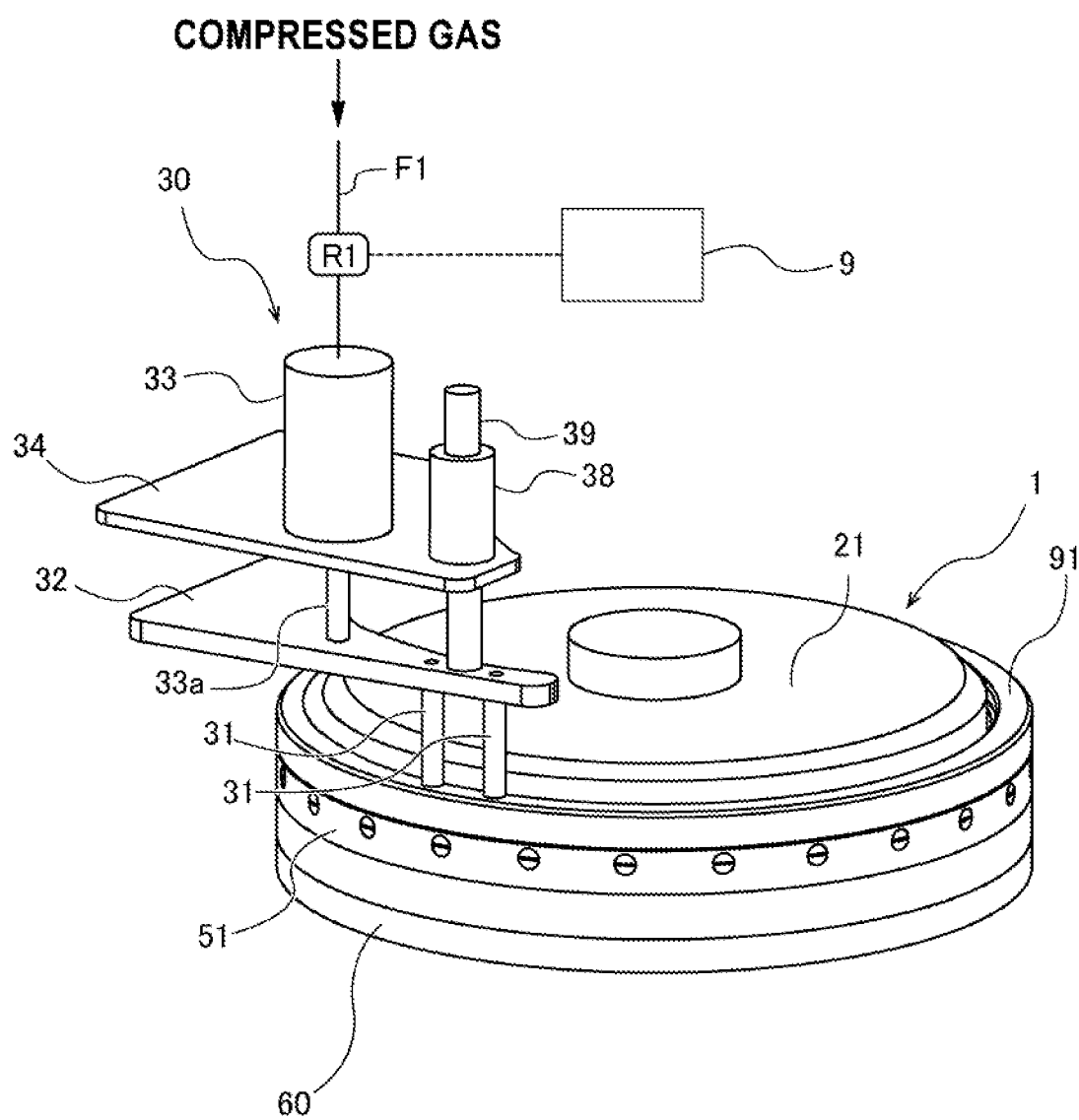
FIG. 6 is a perspective view showing a local-load exerting device.

FIG. 6 is a perspective view of the local-load exerting device 30. As shown in FIG. 6, the local-load exerting device 30 includes two pressing rods 31 configured to apply a downward local load to the stationary ring 91, a bridge 32, an air cylinder (load generator) 33, a load-generating pressure regulator R1 configured to regulate pressure of a compressed gas in the air cylinder 33, a linear guide 38, a guide rod 39, and a unit base 34. Hereinafter, the load-generating pressure regulator R1 is simply referred to as pressure regulator R1.

The unit base 34 is fixed to the polishing-head oscillation arm 16 (see FIG. 3). The air cylinder 33 and the linear guide 38 are mounted to the unit base 34. A piston rod 33a of the air cylinder 33 and the guide rod 39 are coupled to the bridge 32. The guide rod 39 is vertically movably supported by the linear guide 38 with low friction.

A load generated by the air cylinder 33 is transmitted to the bridge 32. The bridge 32 is coupled to the stationary ring 91 via the two pressing rods (pressing members) 31, and the pressing rods 31 transmit the load of the air cylinder 33 applied to the bridge 32 to the stationary ring 91. In this way, the pressing rods 31 apply a local load to a part of the stationary ring 91. The local-load exerting device 30 exerts the downward local load on a part of the retainer ring 60 through the stationary ring 91 and the rotary ring 51. Specifically, the downward local load is transmitted via the stationary ring 91 and the rotary ring 51 to the retainer ring 60.

A combination of the air cylinder 33 and the pressure regulator R1 constitutes an actuator configured to regulate the local load applied to the stationary ring 91 from the pressing rods 31. In one embodiment, the actuator for regulating the local load may be constituted of a combination of a servomotor, a ball screw mechanism, and a motor driver.

The air cylinder 33 is coupled to a compressed-gas supply source (not shown) through a gas delivery line F1. The pressure regulator R1 is attached to the gas delivery line F1. A compressed gas from the compressed-gas supply source is supplied through the pressure regulator R1 into the air cylinder 33. The pressure regulator R1 is electrically connected to the operation controller 9. During polishing of the substrate W, the operation controller 9 instructs the pressure regulator R1 to regulate the pressure of the compressed gas in the air cylinder 33.

The substrate W is polished as follows. While the polishing table 3 and the polishing head 1 are rotated in the direction indicated by the arrows in FIG. 3, the polishing liquid is supplied from the polishing-liquid supply nozzle 5 onto the polishing surface 2a of the polishing pad 2 on the polishing table 3. The substrate W is rotated by the polishing head 1 and pressed against the polishing surface 2a of the polishing pad 2 in the presence of the polishing liquid on the polishing pad 2. The surface of the substrate W is polished by a chemical action of the polishing liquid and a mechanical action of the polishing pad 2 or abrasive grains contained in the polishing liquid.

The polishing apparatus polishes the substrate W while applying the local load from the local-load exerting device 30 to the stationary ring 91 as needed. The rotating retainer ring 60 contacts the polishing surface 2a of the polishing pad 2, while pressing the polishing pad 2 outside the substrate W and exerting the downward local load on a part of the polishing surface 2a. The reason for exerting the downward local load to a part of the retainer ring 60 during polishing of the substrate W is to actively control a profile of the periphery of the substrate W.

When the retainer ring 60 applies the downward local load to a part of the polishing surface 2a, a part of the polishing surface 2a rises upward. The upwardly-raised polishing surface 2a applies in turn an upward local load (local repulsive force) to the substrate W. A polishing rate of a portion of the substrate W to which the local repulsive force is applied increases. A magnitude of the local repulsive force depends on a magnitude of the force with which the retainer ring 60 presses the polishing pad 2, and the polishing rate changes depending on the magnitude of the local repulsive force. Specifically, the greater the local repulsive force, the higher the polishing rate. A position where the local repulsive force is generated depends on a position where the retainer ring 60 applies the local load to the polishing surface 2a. For example, the operation controller 9 instructs the pressure regulator R1 to increase the pressure of the compressed gas in the air cylinder 33 to increase the local load.

Figure 7:
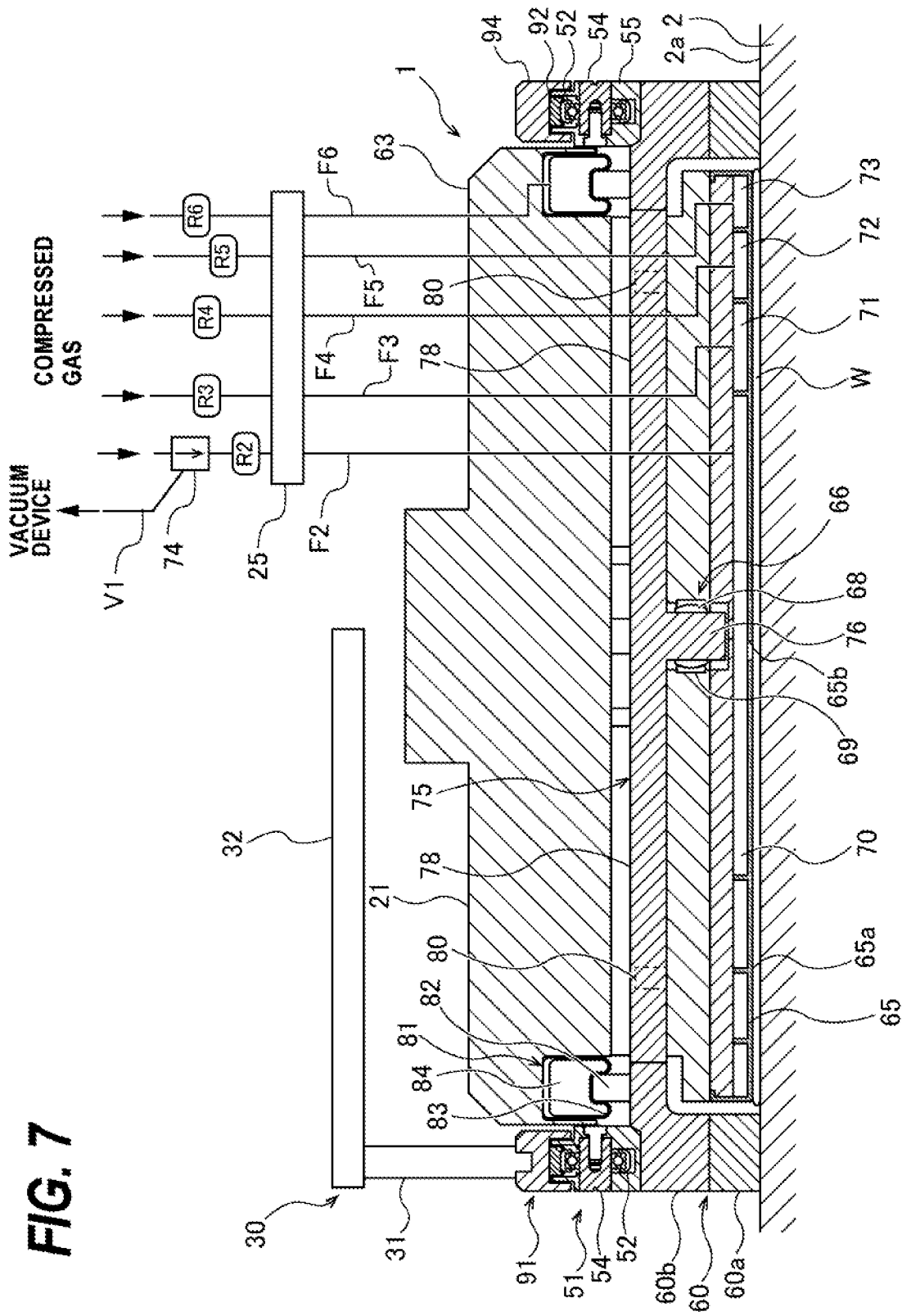
FIG. 7 is a cross-sectional view showing a polishing head.

Next, the details of the polishing head 1 will be described. FIG. 7 is a cross-sectional view of the polishing head 1. The head body 21 includes a carrier 63 coupled to the head shaft 10 (see FIG. 1), an elastic membrane (or a membrane) 65 for pressing the substrate W against the polishing surface 2a, and a spherical bearing 66 supporting the retainer ring 60 while allowing the retainer ring 60 to tilt and move in the vertical directions relative to the carrier 63. The retainer ring 60 is coupled to and supported by the spherical bearing 66 through a coupling member 75. The coupling member 75 is disposed in the carrier 63 and is vertically movable in the carrier 63. The elastic membrane 65 is attached to a lower surface of the carrier 63.

A lower surface of the elastic membrane 65 constitutes a pressing surface 65a configured to press the substrate W against the polishing surface 2a of the polishing pad 2. Four pressure chambers 70, 71, 72, and 73 are provided between the carrier 63 and the elastic membrane 65. The central pressure chamber 70 has a circular shape, and the other pressure chambers 71, 72, and 73 have annular shapes. These pressure chambers 70, 71, 72, and 73 are concentrically arranged. In the present embodiment, the elastic membrane 65 forms the four pressure chambers 70 to 73, but the number of above-described pressure chambers is an example and may be changed as appropriate.

Gas delivery lines F2, F3, F4, and F5 are coupled to the pressure chambers 70, 71, 72, and 73, respectively. Ends of the gas delivery lines F2, F3, F4, and F5 are coupled to a compressed-gas supply source (not shown) which is a utility provided in a factory where the polishing apparatus is installed. Compressed gas, such as compressed air, is supplied to the pressure chambers 70, 71, 72, and 73 through the gas delivery lines F2, F3, F4, and F5, respectively. When the compressed gas is supplied to the pressure chambers 70 to 73, the elastic membrane 65 is inflated, and the compressed gas in the pressure chambers 70 to 73 presses the substrate W against the polishing surface 2a of the polishing pad 2 through the elastic membrane 65. The pressure chambers 70 to 73 function as actuators for pressing the substrate W against the polishing surface 2a of the polishing pad 2.

The elastic membrane 65 has a through-hole 65b that communicates with one of the pressure chambers 70 to 73. Specifically, the through-hole 65b is formed in a portion of the elastic membrane 65 constituting the pressure chamber 70, and the through-hole 65b communicates with the pressure chamber 70. A switching valve 74 is coupled to the gas delivery line F2 communicating with the pressure chamber 70. The gas delivery line F2 is coupled to a vacuum line V1 through the switching valve 74, so that a vacuum can be formed in the pressure chamber 70. End of the vacuum line V1 is coupled to a vacuum device, such as a not-shown vacuum pump. The switching valve 74 is electrically connected to the operation controller 9, and the operation controller 9 instructs the switching valve 74 to establish the fluid communication between the vacuum line V1 and the gas delivery line F2. As a result, the vacuum is formed in the pressure chamber 70.

When the vacuum is formed in the pressure chamber 70, a central portion of the substrate W is attracted, so that the substrate W is attracted and held by the polishing head 1. When the compressed gas is supplied into the pressure chamber 70, the substrate W is released from the polishing head 1. The elastic membrane 65 is made of a highly strong and durable rubber material, such as ethylene propylene rubber (EPDM), polyurethane rubber, and silicone rubber. In one embodiment, the elastic membrane 65 may have a plurality of through-holes communicating with the plurality of pressure chambers 70 to 73. Further, in one embodiment, switching valves may be coupled to two or more of the gas delivery lines F2 to F5, and the two or more gas delivery lines may be coupled to the vacuum line through the switching valves. An example of the switching valve includes a three-way valve.

The retainer ring 60 is arranged so as to surround the substrate W and the pressing surface 65a of the elastic membrane 65. The retainer ring 60 has a ring member 60a that is to contact the polishing pad 2, and a drive ring 60b fixed to an upper portion of the ring member 60a. The ring member 60a is secured to the drive ring 60b by a now-shown plurality of bolts.

The coupling member 75 includes a shaft portion 76 located in the center of the head body 21, and a plurality of spokes 78 extending radially from the shaft portion 76. The shaft portion 76 extends in the vertical direction through the spherical bearing 66 that is located in the center of the head body 21. The shaft portion 76 is supported by the spherical bearing 66 such that the shaft portion 76 can be movable in the vertical directions. The drive ring 60b is coupled the spokes 78. With these configurations, the coupling member 75 and the retainer ring 60, which is coupled to the coupling member 75, can move relative to the head body 21 in the vertical directions.

The spherical bearing 66 includes an inner race 68 and an outer race 69. The outer race 69 slidably supports an outer circumferential surface of the inner race 68. The inner race 68 is coupled to the retainer ring 60 through the coupling member 75. The outer race 69 is fixed to the carrier 63. The shaft portion 76 of the coupling member 75 is supported by the inner race 68 such that the shaft portion 76 can move in the vertical directions. The retainer ring 60 is tiltably supported by the spherical bearing 66 through the coupling member 75.

The spherical bearing 66 is configured to allow the retainer ring 60 to move in the vertical directions and tilt, while restricting a lateral movement (horizontal movement) of the retainer ring 60. During polishing of the substrate W, the retainer ring 60 receives from the substrate W a lateral force (an outward force in the radial direction of the substrate W) that is generated due to the friction between the substrate W and the polishing pad 2. This lateral force is bore or received by the spherical bearing 66. In this manner, the spherical bearing 66 serves as a bearing device configured to receive the lateral force (the outward force in the radial direction of the substrate W) that is applied from the substrate W to the retainer ring 60 due to the friction between the substrate W and the polishing pad 2 during polishing of the substrate W, while restricting the lateral movement of the retainer ring 60 (i.e., fixing the horizontal position of the retainer ring 60).

Plural pairs of drive collars 80 are fixed to the carrier 63. Each pair of drive collars 80 are arranged on both sides of each spoke 78. The rotation of the carrier 63 is transmitted to the retainer ring 60 via the drive collars 80, such that the head body 21 and the retainer ring 60 can rotate together. The drive collars 80 are just in contact with the spokes 78 and do not prevent the vertical movement and the tilt of the coupling member 75 and the retainer ring 60.

The upper portion of the retainer ring 60 is coupled to an annular retainer-ring pressing mechanism 81, which is configured to exert a uniform downward load on an entire upper surface of the retainer ring 60 (more specifically, an upper surface of the drive ring 60b) to thereby press a lower surface of the retainer ring 60 (i.e., a lower surface of the ring member 60a) against the polishing surface 2a of the polishing pad 2.

The retainer-ring pressing mechanism 81 includes an annular piston 82 secured to the upper portion of the drive ring 60b, and an annular rolling diaphragm 83 coupled to an upper surface of the piston 82. The rolling diaphragm 83 forms a pressure chamber 84 therein. The pressure chamber 84 is coupled to the above-described compressed-gas supply source through a gas delivery line F6. The compressed gas is supplied into the pressure chamber 84 through the gas delivery line F6.

When the compressed gas is supplied into the pressure chamber 84 from the compressed-gas supply source, the rolling diaphragm 83 pushes the piston 82 downward, and the piston 82 pushes the entire retainer ring 60 downward. In this manner, the retainer-ring pressing mechanism 81 presses the lower surface of the retainer ring 60 against the polishing surface 2a of the polishing pad 2.

The gas delivery lines F2, F3, F4, F5, and F6 extend via a rotary joint 25 attached to the head shaft 10. The polishing apparatus further includes a plurality of pressure-chamber pressure regulators R2, R3, R4, R5, and R6 coupled to the plurality of pressure chambers 70, 71, 72, 73, and 84, respectively. Hereinafter, the pressure-chamber pressure regulators R2, R3, R4, R5, and R6 are simply referred to as pressure regulators R2, R3, R4, R5, and R6.

The pressure regulators R2, R3, R4, R5, and R6 are mounted to the gas delivery lines F2, F3, F4, F5, and F6, respectively. The compressed gas from the compressed-gas supply source is independently supplied into the pressure chambers 70 to 73 and the pressure chamber 84 through the pressure regulators R2 to R6. The pressure regulators R2 to R6 are configured to regulate the pressure of the compressed gas in the pressure chambers 70 to 73 and the pressure chamber 84. The pressure regulators R2 to R6 are coupled to the operation controller 9.

The pressure regulators R2 to R6 can change the internal pressures of the pressure chambers 70 to 73 and the pressure chamber 84 independently, such that the pressure regulators R2 to R6 can independently regulate the pressing forces of the substrate W against the polishing surface 2a in corresponding four regions of the substrate W, i.e., a central portion, an inner intermediate portion, an outer intermediate portion, and an edge portion, and the pressing force of the retainer ring 60 against the polishing pad 2. Hereinafter, in this specification, the corresponding three regions of the substrate W, i.e., the inner intermediate portion, the outer intermediate portion, and the edge portion may be collectively referred to as an outer portion. In the present embodiment, the elastic membrane 65 forms the four pressure chambers 70 to 73, while in one embodiment, the elastic membrane 65 may form less than four pressure chambers or more than four pressure chambers.

The film thickness data containing the plurality of film thicknesses at the plurality of measurement points on the substrate W measured by the film-thickness measuring device 40 shown in FIG. 3 is transmitted to the operation controller 9. The operation controller 9 instructs the pressure regulators R2 to R5 to independently regulate the pressing forces on the corresponding four regions of the substrate W against the polishing surface 2a based on the plurality of film thicknesses measured by the film-thickness measuring device 40. In an example, the operation controller 9 compares a film thickness of the central portion of the substrate W with a film thickness of the other portion of the substrate W, and when the film thickness of the central portion is larger than the film thickness of the other portion, the operation controller 9 instruct the pressure regulator R2 to increase the internal pressure of the pressure chamber 70.

The rotary ring 51 includes a plurality of rollers 52, roller shafts 54 configured to support the rollers 52 respectively, and a roller housing 55 to which the roller shafts 54 are fixed. The roller housing 55 has an annular shape and is fixed to the upper surface of the retainer ring 60. Each roller 52 has a bearing (not shown) mounted to the roller shaft 54 such that the roller 52 can rotate around the roller shaft 54.

The stationary ring 91 includes an annular rail 92 which is in contact with tops of the rollers 52, and an annular rail base 94 to which the annular rail 92 is fixed. An annular groove is formed in a lower surface of the annular rail 92, and the tops of the rollers 52 are in contact with the annular groove. The rollers 52 are rotatable while being in rolling contact with the annular rail 92. The pressing rods 31 are coupled to a top portion of the rail base 94.

Figure 8:
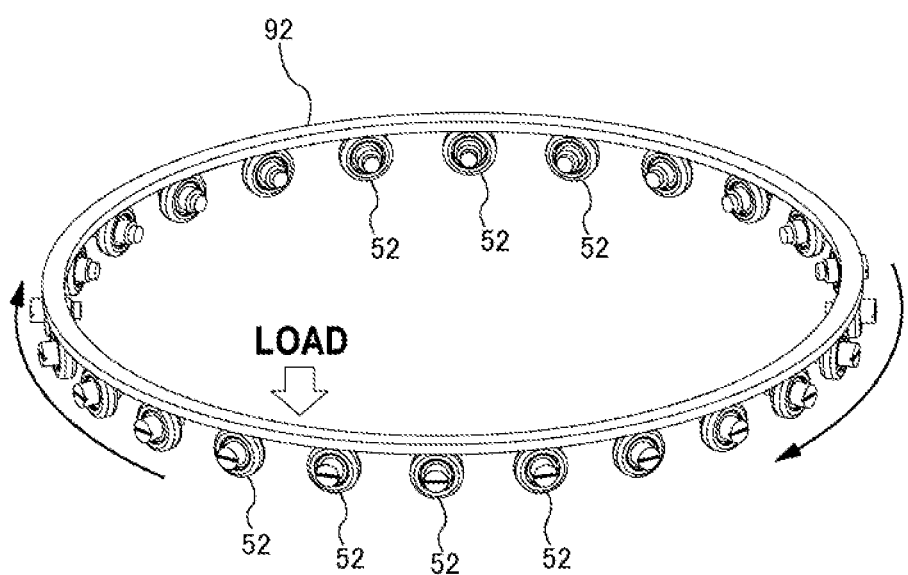
FIG. 8 is a perspective view showing rollers and an annular rail.

FIG. 8 is a perspective view of the rollers 52 and the annular rail 92. During polishing of the substrate, the rollers 52 revolve together with the retainer ring 60, while the annular rail 92 remains stationary. Accordingly, each roller 52 makes rolling contact with the annular rail 92. Each roller 52 receives the load only when the roller 52 passes a point of application of the load (directly below the pressing rods 31). The downward local load of the local-load exerting device 30 is transmitted from the annular rail 92 to the roller 52, and is transmitted to the retainer ring 60 via the roller 52.

Figure 9:
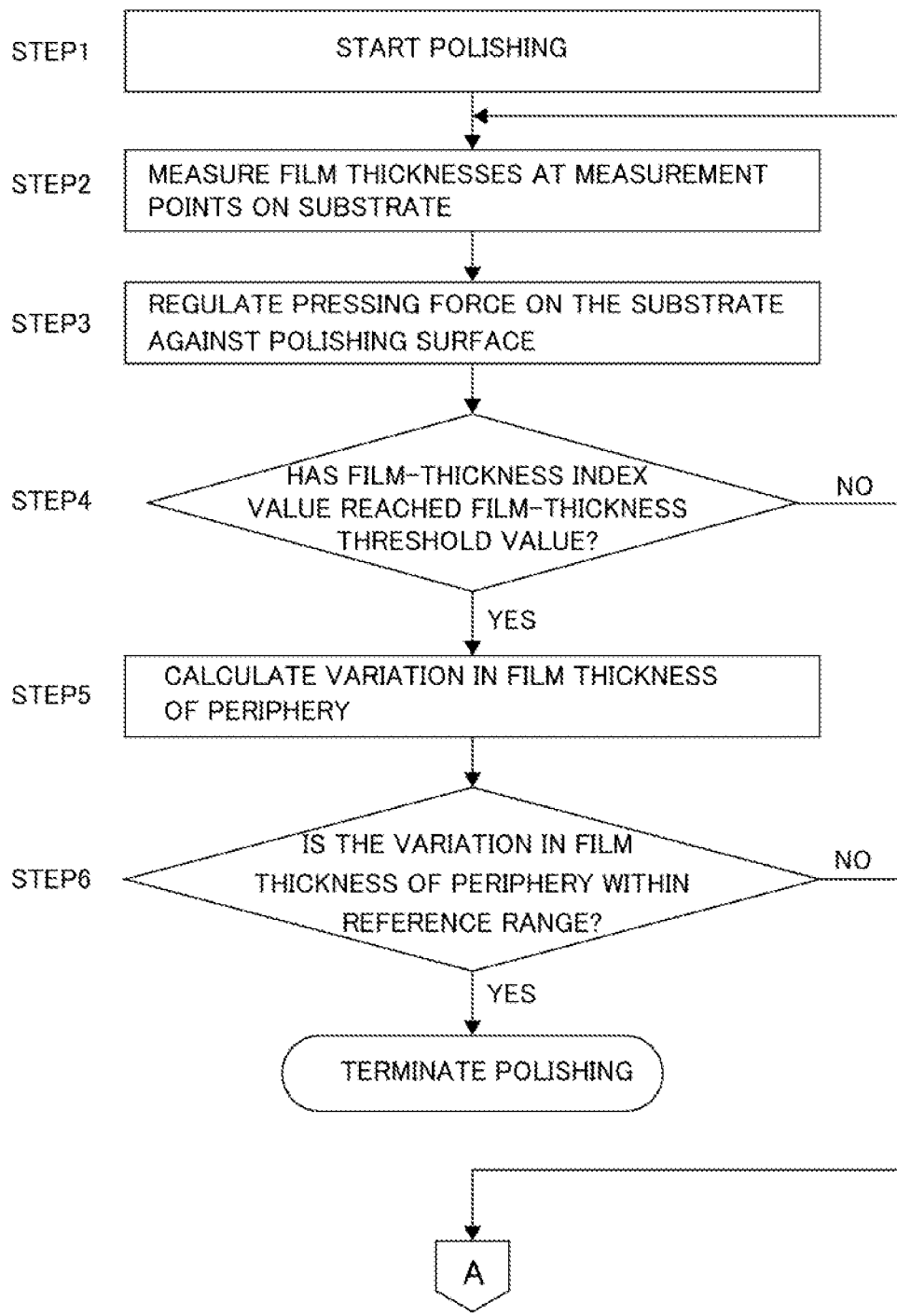
FIG. 9 is a flowchart showing an embodiment of a polishing method for a substrate.
Figure 10:
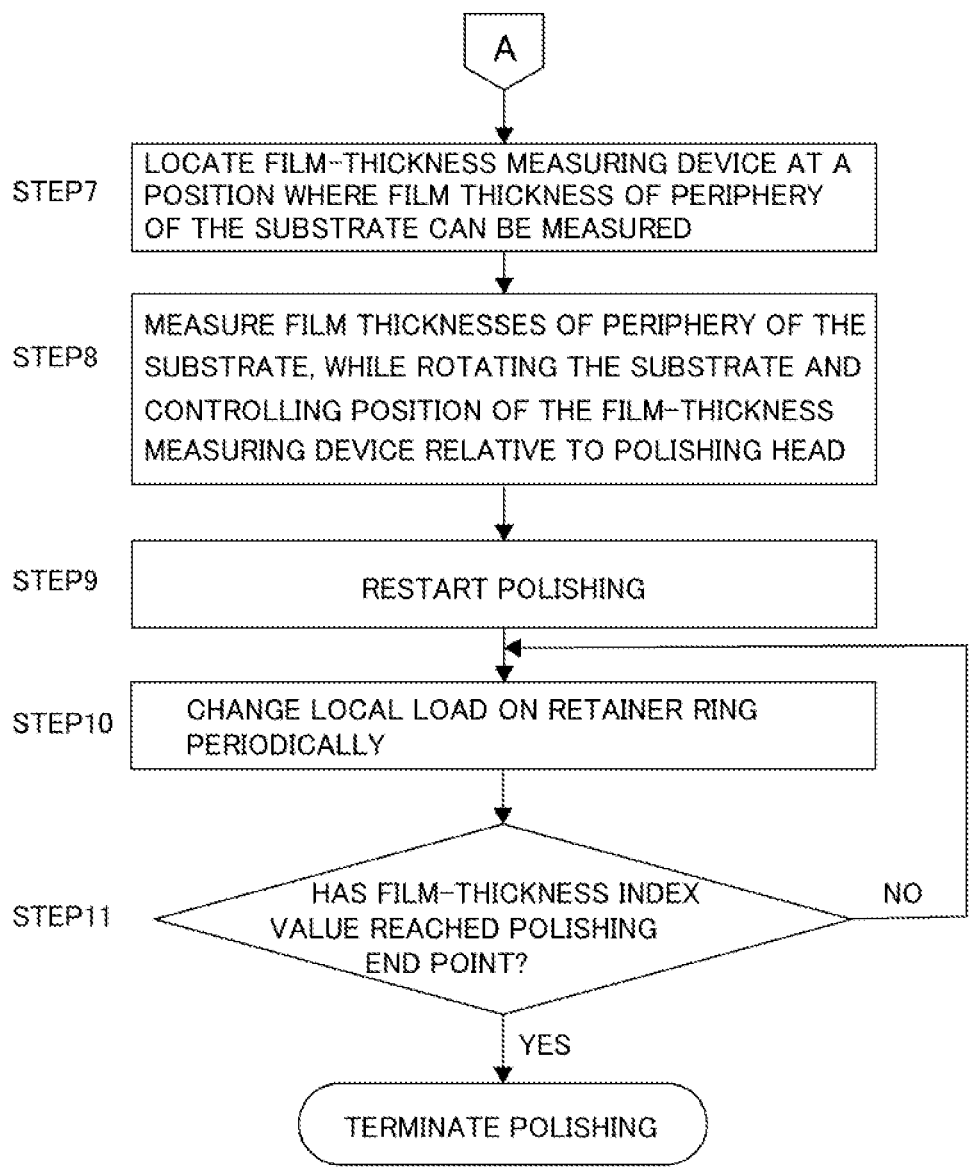
FIG. 10 is a flowchart showing an embodiment of the polishing method for the substrate.

Hereinafter, a film-thickness measuring method for the substrate W, a polishing method for repairing a variation in the film thickness of the substrate W based on the film thickness measured using such a method, and a method of detecting the notch portion will be described below according to flowcharts shown in FIGS. 9 and 10. FIGS. 9 and 10 are flowcharts showing an embodiment of the polishing method for the substrate W. In the present embodiment, the film-thickness measuring method for the substrate W, the polishing method of repairing a variation in the film thickness of the substrate W, and the method of detecting the notch portion are incorporated in a series of polishing processes. Hereinafter, as an example, a film-thickness measuring method for the periphery of the substrate W and a polishing method for repairing the variation in the film thickness of the periphery of the substrate W will be described.

In steps 1 to 5, the polishing apparatus performs an initial polishing process. In the initial polishing process, the polishing apparatus measures a plurality of film thicknesses at a plurality of measurement points on the substrate W, and polishes the substrate W while regulating the pressing forces on the substrate W against the polishing surface 2a based on the plurality of film thicknesses. The initial polishing process is performed until the film thickness of the substrate W reaches a predetermined film-thickness threshold value or a polishing time reaches a predetermined initial-polishing end time.

In step 1, the polishing apparatus starts polishing of the substrate W. Specifically, the table motor 6 rotates the polishing table 3 together with the polishing pad 2 at a constant rotation speed, and the polishing-head rotating motor 12 rotates the polishing head 1 at a constant rotation speed to rotate the substrate W at a constant rotation speed. Further, the polishing head 1 presses the substrate W against the polishing surface 2a of the polishing pad 2 to start the polishing of the substrate W.

In step 2, the film-thickness measuring device 40 measures the plurality of film thicknesses at the plurality of measurement points on the substrate W. Specifically, the optical film-thickness measuring device 40 irradiates the substrate W with the light multiple times when the optical sensor head 7 sweeps across the substrate W, and measures intensities of reflected lights at respective wavelengths. The optical film-thickness measuring device 40 generates a plurality of spectra of the reflected lights from the intensity measurement data of the plurality of reflected lights. The optical film-thickness measuring device 40 determines a plurality of film thicknesses at the respective measurement points based on the plurality of spectra. The operation controller 9 instructs the optical film-thickness measuring device 40 to perform the step 2.

In step 3, the pressing forces on the substrate W against the polishing surface 2a are regulated based on the plurality of film thicknesses measured in the step 2. Specifically, the operation controller 9 obtains the film-thickness data measured in the step 2 from the optical film-thickness measuring device 40, determines the internal pressures of the pressure chambers 70 to 73 of the polishing head 1 based on the plurality of film thicknesses, and instructs at least one of the pressure regulators R2 to R5 to regulate the pressing force(s) on the substrate W against the polishing surface 2a.

In step 4, the operation controller 9 compares a film-thickness index value representing a film thickness of the substrate W with a predetermined film-thickness threshold value. When the film-thickness index value does not reach the film-thickness threshold value, the process returns to the step 2. When the film-thickness index value has reached the film-thickness threshold value, a step 5 described later is performed. In one embodiment, the operation controller 9 calculates an average value of the plurality of film thicknesses of the substrate W at the plurality of measurement points based on the obtained film-thickness data, and the average value of the plurality of film thicknesses may be used as the film-thickness index value. Alternatively, a maximum value or a minimum value of the plurality of film thicknesses may be used as the film-thickness index value, or a film thickness at one measurement point arbitrarily selected from the plurality of measurement points may be used as the film-thickness index value.

Further, in one embodiment, the operation controller 9 may compare a current polishing time with the predetermined initial-polishing end time. When the current polishing time does not reach the initial-polishing end time, the operation controller 9 may perform the step 2 again. When the current polishing time has reached the initial-polishing end time, the operation controller 9 may perform step 5 described later. The above-mentioned film-thickness threshold value and the initial-polishing end time are determined based on a film thickness or a polishing time required for repairing the variation in the film thickness of the substrate W in a repair-polishing process, which will be described later.

In step 5, the operation controller 9 calculates a variation of a plurality of film thicknesses at a plurality of measurement points on the periphery of the substrate W. In one embodiment, the variation in the film thickness of the periphery may be represented by a standard deviation or a difference between a maximum value and a minimum value of the plurality of film thicknesses of the periphery. In one embodiment, the operation controller 9 may generate a film-thickness profile representing a relationship between a plurality of positions on the substrate W and a plurality of film thicknesses at the plurality of positions, and may calculate the variation in the film thickness of the periphery from this film-thickness profile.

In step 6, the operation controller 9 compares the calculated variation in the film thickness of the periphery with a predetermined reference range. When the variation in the film thickness of the periphery is within the reference range, the polishing of the substrate W is terminated. When the variation in the film thickness of the periphery is out of the reference range, a periphery film-thickness measuring process (step 7 and step 8), which will be described later, is performed. Although the film thicknesses of the periphery can be measured by the step 2, the film thicknesses of the periphery of the substrate W can be measured more accurately by the periphery film-thickness measuring process.

Figure 11:
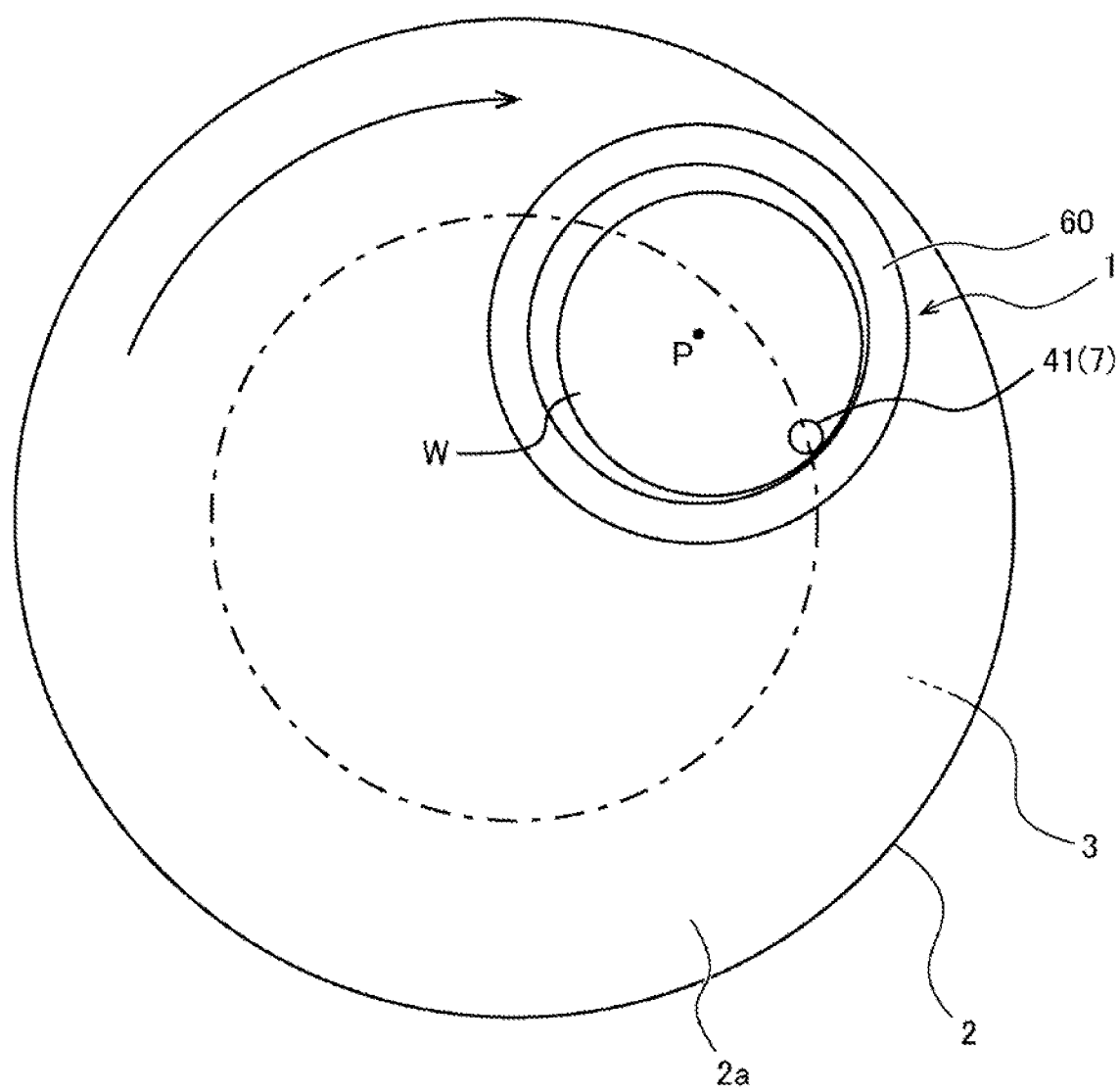
FIG. 11 is a diagram showing a position of a film-thickness sensor.

In step 7, the operation controller 9 locates the film-thickness measuring device 40 (more specifically, the film-thickness sensor 41) at an arbitrary position on the substrate W where a film thickness can be measured. Specifically, the operation controller 9 locates the film-thickness measuring device 40 at a position where a film thickness of the periphery of the substrate W can be measured. More specifically, as shown in FIG. 11, the operation controller 9 instructs the table motor 6 (not shown in FIG. 11) to stop the rotation of the polishing table 3 such that the film-thickness sensor 41 (when the film-thickness measuring device 40 is the optical film-thickness measuring device, the film-thickness sensor 41 is the optical sensor head 7) is located directly below an arbitrary film-thickness measuring position (i.e., the periphery) of the substrate W. The position of the film-thickness sensor 41 can be calculated based on rotation angles of the polishing head 1, the polishing table 3, and the polishing-head oscillation arm 16.

In one embodiment, the rotation of the polishing table 3 and/or the rotation of the polishing head 1 may be stopped before the step 7. In this case, the operation controller 9 instructs the table motor 6 to rotate the polishing table 3, and then stop the rotation of the polishing table 3 such that the film-thickness sensor 41 is located directly below the periphery of the substrate W.

In step 8, the operation controller 9 instructs the film-thickness measuring device 40 to measure film thicknesses of the periphery of the substrate W, while the operation controller 9 instructs the polishing-head rotating motor 12 to rotate the polishing head 1 to rotate the substrate W, and while the operation controller 9 controls a position of the film-thickness measuring device 40 (more specifically, the film-thickness sensor 41) relative to the polishing head 1. Specifically, the polishing head 1 rotates the substrate W on the polishing surface 2a of the polishing pad 2. In one embodiment, the rotation of the polishing head 1 may be continued from the step 1.

Figure 12:
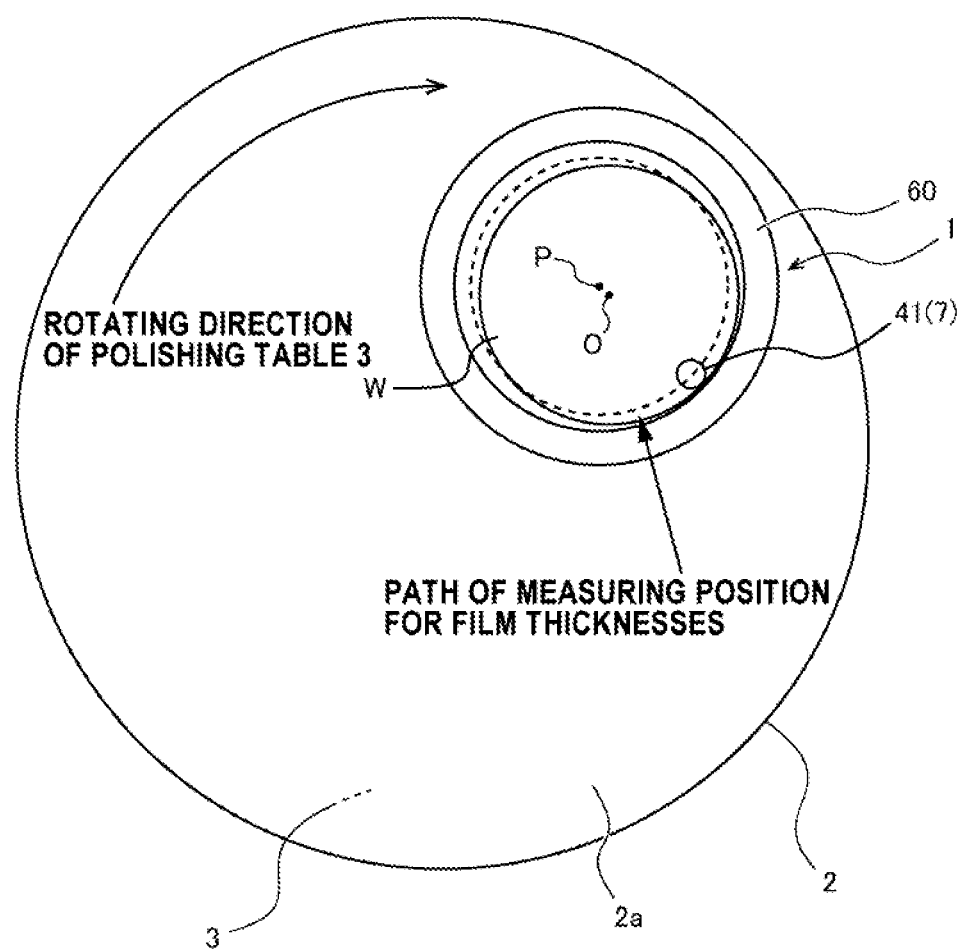
FIG. 12 is a diagram showing a path of a film-thickness measuring position.

As shown in FIG. 12, an inner diameter of the retainer ring 60 is larger than an outer diameter of the substrate W by 1 mm to 3 mm. Therefore, during the polishing process, the substrate W is biased downstream (downstream in the rotating direction of the polishing table 3) inside the retainer ring 60 while the substrate W rotates. When the polishing head 1 is rotated for measuring of the film thicknesses of the substrate W with the substrate W biased to a part of an inner wall of the retainer ring 60, the substrate W rotates eccentrically around the center P of the polishing head 1 while the substrate W rotates about the center O of the substrate W. Therefore, as shown in FIG. 12, when the film thicknesses of the periphery are measured while rotating the substrate W with a fixed position of the film-thickness measuring device 40 (film-thickness sensor 41) relative to the polishing head 1, a path of the measuring position (the path of the measuring position when viewed from the substrate W) deviates from the periphery of the substrate W. As a result, the film thicknesses of the periphery cannot be measured correctly.

Thus, the operation controller 9 controls the position of the film-thickness measuring device 40 relative to the polishing head 1 by controlling at least one of the oscillating motor 15 and the table motor 6 in synchronization with the rotation of the polishing head 1.

Figure 13:
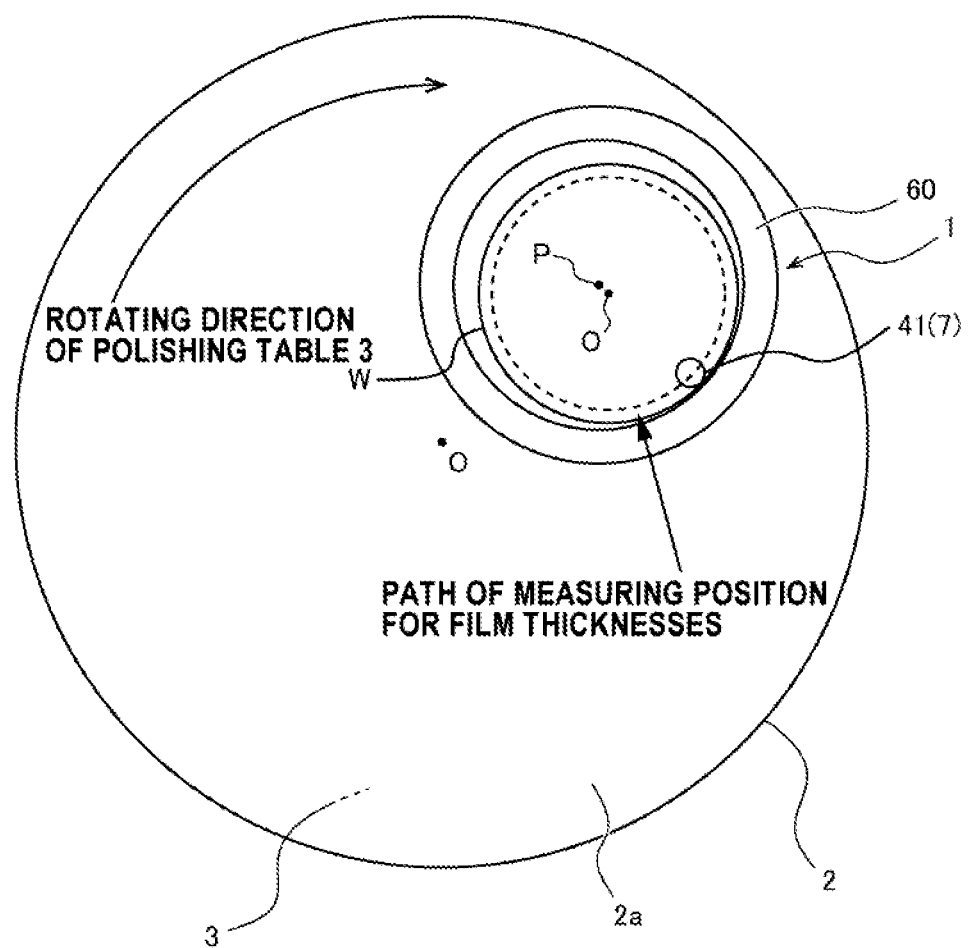
FIG. 13 is a diagram showing a path of a film-thickness measuring position.

Specifically, as shown in FIG. 13, the operation controller 9 controls (trace-controls) the position of the film-thickness measuring device 40 relative to the polishing head 1 by controlling at least one of the oscillating motor 15 and the table motor 6 based on the rotation angle of the polishing head 1 such that the measuring position for the film thicknesses traces a path extending in a circumferential direction of the periphery of the substrate W. In other words, the operation controller 9 moves (rotates or oscillates) the polishing table 3 and/or the polishing head 1 in synchronization with the rotation of the polishing head 1 by an amount of eccentricity of the substrate W with respect to the center P of the polishing head 1 such that the measuring position for the film thicknesses traces the periphery of the substrate W. The film-thickness measuring device 40 measures the plurality of film thicknesses at the plurality of measurement points on the path of the measuring position while the substrate W makes one rotation. The measuring position for the film thicknesses traces an entire circumference on the periphery centered on the center O of the substrate W.

The amount of eccentricity of the substrate W with respect to the center P of the polishing head 1 can be estimated from the inner diameter of the retainer ring 60 and the outer diameter of the substrate W. Moreover, since the substrate W is biased to the downstream in the rotating direction of the polishing table 3 during the polishing process, an eccentric direction of the substrate W with respect to the polishing head 1 (i.e., an eccentric direction with respect to the center P) can be estimated. Therefore, by controlling the position of the film-thickness measuring device 40 relative to the polishing head 1, the position of the film-thickness measuring device 40 relative to the substrate W can be controlled. By controlling the position of the film-thickness measuring device 40 relative to the polishing head 1 in synchronization with the rotation of the polishing head 1, the film thickness of the periphery can be measured accurately.

In one embodiment, after the measuring position for the film thicknesses traces the entire circumference on the periphery centered on the center O of the substrate W, the position of the film-thickness measuring device 40 may be shifted in the radial direction of the polishing head 1, so that the film-thickness measuring device 40 may measure film thicknesses at a plurality of measurement points of the substrate W on other circumference having a different diameter. The film thicknesses can be measured more precisely by measuring the film thicknesses on a plurality of circumferences on the periphery of the substrate W.

Figure 14:
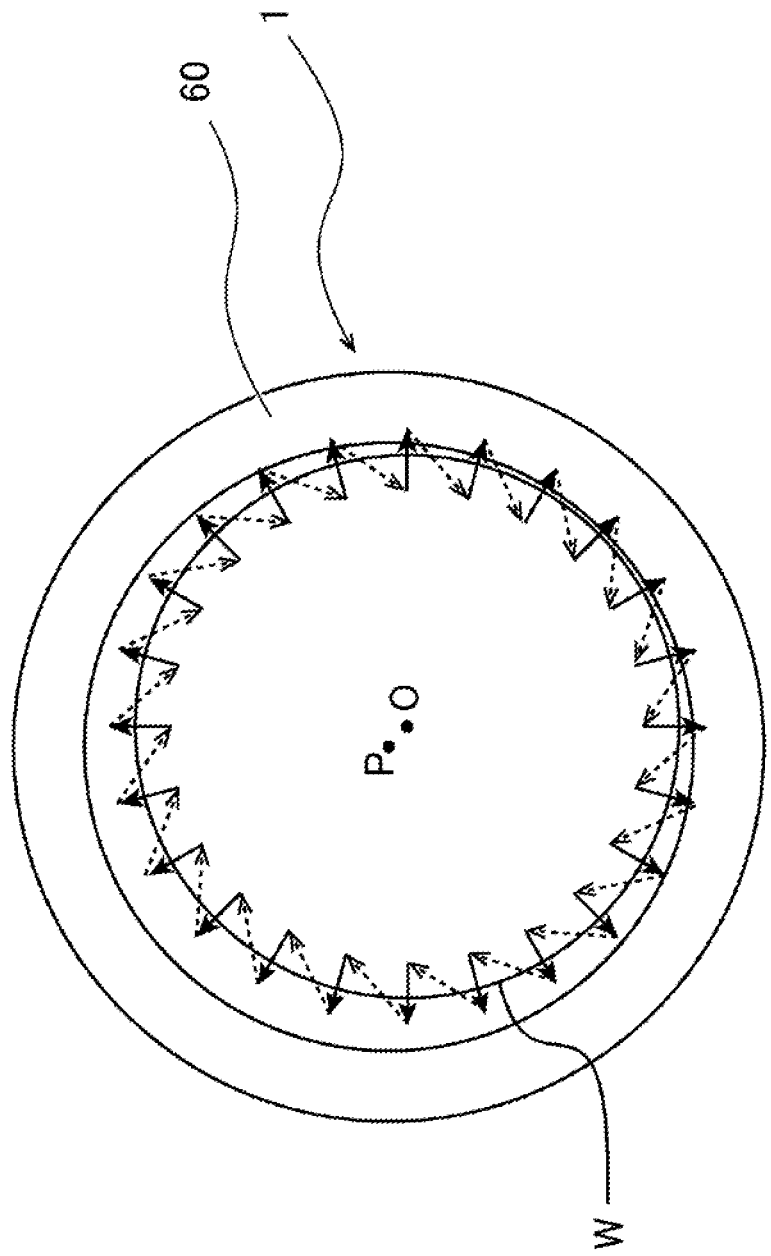
FIG. 14 is a diagram showing another embodiment of a film-thickness measuring method.

In one embodiment, the film thicknesses may be measured including the eccentricity of the substrate W. Specifically, as shown in FIG. 14, the operation controller 9 may control the position of the film-thickness measuring device 40 relative to the polishing head 1, by controlling at least one of the oscillating motor 15 and the table motor 6 in synchronization with the rotation of the polishing head 1 (i.e., by moving the polishing table 3 and/or the polishing head 1 in synchronization with the rotation of the polishing head 1) such that the measuring position for the film thicknesses moves in the radial direction of the substrate W in a plurality of regions arranged in the circumferential direction of the substrate W. The plurality of regions include at least the periphery of the substrate W.

The measuring position for the film thicknesses moves in the circumferential direction while moving in the radial direction to trace the entire circumference of the periphery of the substrate W. The film-thickness measuring device 40 measures a plurality of film thicknesses at the plurality of measurement points on paths of the measuring position while the substrate W makes one rotation. Arrows shown by solid lines in FIG. 14 indicate the paths of the measuring position as viewed from the substrate W when the film-thickness measuring device 40 is measuring the film thickness. Arrows shown by dotted lines in FIG. 14 indicate the paths of the film-thickness sensor 41 as viewed from the substrate W when the film-thickness measuring device 40 is not measuring the film thickness. The film thicknesses can be measured more precisely by increasing the number of paths of the measuring position in the circumferential direction.

In the present embodiment, the film thickness is measured when the position of the film-thickness measuring device 40 relative to the substrate W is moving from the inside to the outside of the substrate W. In one embodiment, the film thickness may be measured when the position of the film-thickness measuring device 40 relative to the substrate W is moving from the outside to the inside of the substrate W. An innermost measurement point in the radial direction is a point on an innermost circumference in the periphery of the substrate W or a point radially inwardly of the innermost circumference in the periphery of the substrate W. An outermost measurement point in the radial direction is a point on an outermost circumference in the periphery of the substrate W or a point on the inner diameter of the retainer ring 60. The described-above innermost measurement point and outermost measurement point can be determined from the rotation angle of the polishing head 1, the rotation angle of the polishing table 3, the amount of eccentricity (eccentric direction) of the substrate W relative to the center P, etc. Further, the position of the periphery of the substrate W can be determined accurately by measuring the region outside the substrate W. This is because the measurement result of the film thickness becomes zero in an outer edge of the substrate W. This makes it possible to accurately determine a position where the film-thickness measuring device 40 is measuring in the periphery in each measurement when moving in the radial direction. In one embodiment, also in the embodiment described with reference to FIG. 14, the position of the film-thickness measuring device 40 relative to the polishing head 1 may be controlled based on the rotation angle of the polishing head 1.

Figure 15:
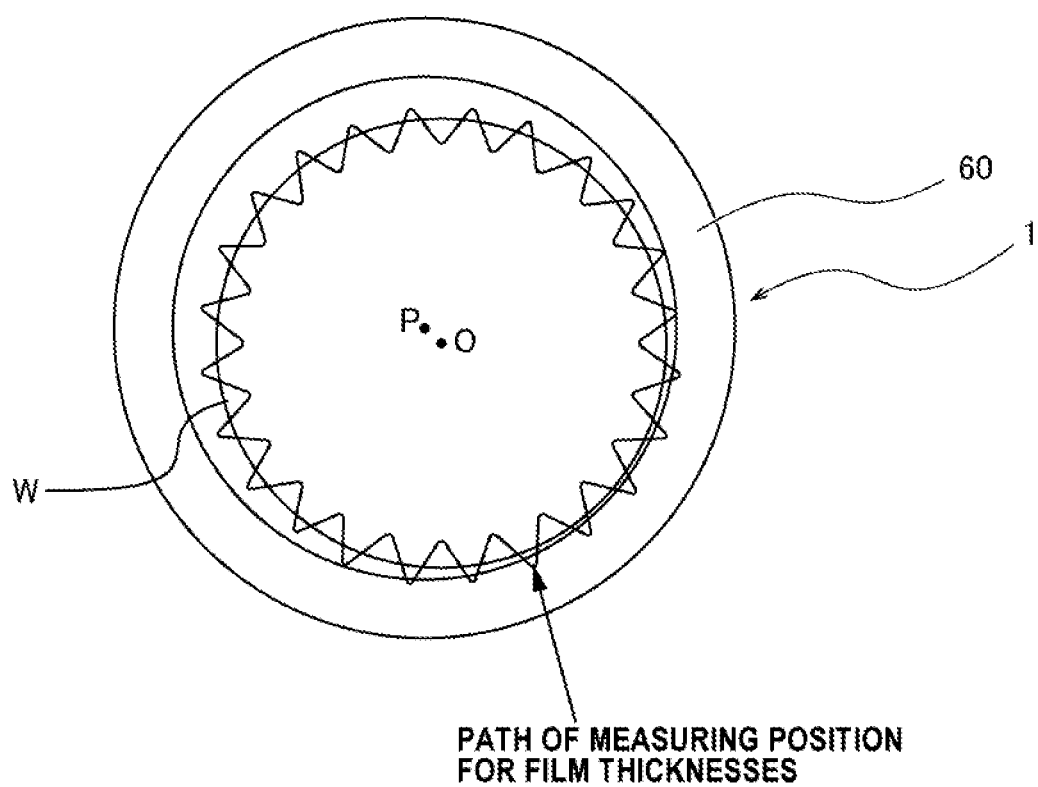
FIG. 15 is a diagram showing another embodiment of the film-thickness measuring method.

Further, in one embodiment, as shown in FIG. 15, the operation controller 9 may control the position of the film-thickness measuring device 40 relative to polishing head 1 by controlling at least one of the oscillating motor 15 and the table motor 6 in synchronization with the rotation of the polishing head 1 (i.e., by moving the polishing table 3 and/or the polishing head 1 in synchronization with the rotation of the polishing head 1) such that the measuring position for the film thicknesses moves in the circumferential direction of the substrate while meandering in a region including at least the periphery of the substrate. The measuring position for the film thicknesses traces the entire circumference of the periphery of the substrate W while meandering. The film-thickness measuring device 40 measures a plurality of film thicknesses at a plurality of measurement points on a path of the film-thickness measuring position while the substrate W makes one rotation. An innermost measurement point in the radial direction is a point on an innermost circumference in the periphery of the substrate W or a point radially inwardly of the innermost circumference in the periphery of the substrate W. An outermost measurement point in the radial direction is a point on an outermost circumference in the periphery of the substrate W or a point on the inner diameter of the retainer ring 60.

In one embodiment, also in the embodiment described with reference to FIG. 15, the position of the film-thickness measuring device 40 relative to the polishing head 1 may be controlled based on the rotation angle of the polishing head 1.

The measuring method described with reference to FIG. 14 is easy to associate the measuring position for the film thicknesses with the measurement values of the film thicknesses, while this method entails a long measuring time. The embodiment described with reference to FIG. 15 requires calculating the measuring position for the film thicknesses by coordinate transformation or other method, while a measuring time is short because the measuring of the film thicknesses can be performed with continuous operation.

During the measuring of the periphery of the substrate W, the substrate W is kept in tight contact with the polishing pad 2, and the substrate W is pressed by the polishing head 1 so that the substrate W does not slide with respect to the polishing head 1. Specifically, during the measuring of the film thickness of the periphery of the substrate W, the operation controller 9 instructs the plurality of pressure regulators R2 to R5 to regulate the pressures in the plurality of pressure chambers 70 to 73 such that the polishing head 1 presses the substrate W against the polishing surface 2a.

In one embodiment, during the measuring of the film thickness of the periphery of the substrate W, the operation controller 9 may instruct the plurality of pressure regulators R3 to R5 to regulate the pressures in the pressure chambers 71 to 73 so as to press the outer portion of the substrate W against the polishing surface 2a, while the operation controller 9 may instruct the switching valve 74 to provide a fluid communication between the gas delivery line F2 and the vacuum line V1 to attract the central portion of the substrate W. In this case, in order to suppress a deformation of the substrate W, the operation controller 9 may instruct the elevating device to lower a height of the polishing head 1 so as to reduce inflations of the pressure chambers 71 to 73.

As described above, in the present embodiment, the film thicknesses of the periphery of the substrate W are measured while the position of the film-thickness measuring device 40 relative to the polishing head 1 is controlled. As a result, the measurement accuracy of the film thicknesses of the periphery can be improved, and a film-thickness distribution of the periphery can be determined accurately.

Further, in one embodiment, the operation controller 9 may perform the above-described periphery film-thickness measuring process in order to detect a position of the notch portion of the substrate W. The operation controller 9 determines the position of the notch portion based on the measurement result of the film thicknesses of the periphery of the substrate W obtained in the periphery film-thickness measuring process. Since the notch portion is cut in the substrate W, the measurement result of the film thickness indicates an error. Therefore, the operation controller 9 can detect the position of the notch portion of the substrate W based on the rotation angle of the polishing head 1 when the film-thickness measuring device 40 outputs an error signal. Film thicknesses of the substrate W may be measured by a film-thickness measuring device (hereinafter, referred to as a stand-alone-type film-thickness measuring device) installed separately from the polishing apparatus, and the repair-polishing process described later may be performed based on the measurement result. In that case, it is necessary to determine positions on the substrate W corresponding to measured values of the film thicknesses of the substrate W measured by the stand-alone-type film-thickness measuring device during the repair-polishing. By performing the periphery film-thickness measuring process to detect the notch portion, a plurality of positions on the substrate W corresponding to a plurality of measured values of the film thicknesses can be determined with the notch portion as a reference.

As a result, the repair-polishing process described later can be performed using the measurement result of the film thicknesses of the periphery measured by the stand-alone-type film-thickness measuring device. In the present embodiment, the film thicknesses of the periphery of the substrate W are measured while the position of the film-thickness measuring device 40 relative to the polishing head 1 is controlled, so that the position of the notch portion of the substrate W can be detected accurately.

The polishing apparatus performs the repair-polishing process (steps 9 to 11) after the periphery film-thickness measuring process. The repair-polishing process is a process of repairing or correcting a variation in the film thickness of the periphery based on the film thicknesses of the periphery of the substrate W measured in the periphery film-thickness measuring process.

In step 9, the polishing apparatus restarts the polishing of the substrate W. In the step 9, the substrate W is polished while film thicknesses of the substrate W are measured in the same way as in the steps 1 and 2.

In step 10, during the polishing of the substrate W, the polishing apparatus periodically changes a local load on the retainer ring 60 in synchronization with the rotation angle of the polishing head 1 based on the measurement result of the film thicknesses of the periphery measured in the periphery film-thickness measuring process or measurement result of the film thicknesses of the periphery measured by the stand-alone-type film-thickness measuring device.

Specifically, when a portion having a large film thickness of the periphery of the substrate W (i.e., a portion at which the polishing rate of the substrate W is to be increased) is at a position receiving the local repulsive force generated by the local-load exerting device 30, the operation controller 9 instructs the local-load exerting device 30 to generate the local load. More specifically, when the portion having a large film thickness of the substrate W is at the position receiving the local repulsive force generated by the local-load exerting device 30, the operation controller 9 instructs the pressure regulator R1 to increase the pressure of the compressed gas inside the air cylinder 33. As a result, polishing of the portion receiving the local repulsive force is relatively accelerated as compared with other areas of the periphery. In one embodiment, a magnitude of the local load (i.e., a magnitude of the pressure of the compressed gas in the air cylinder 33) may be changed according to the film thickness.

Figure 16:
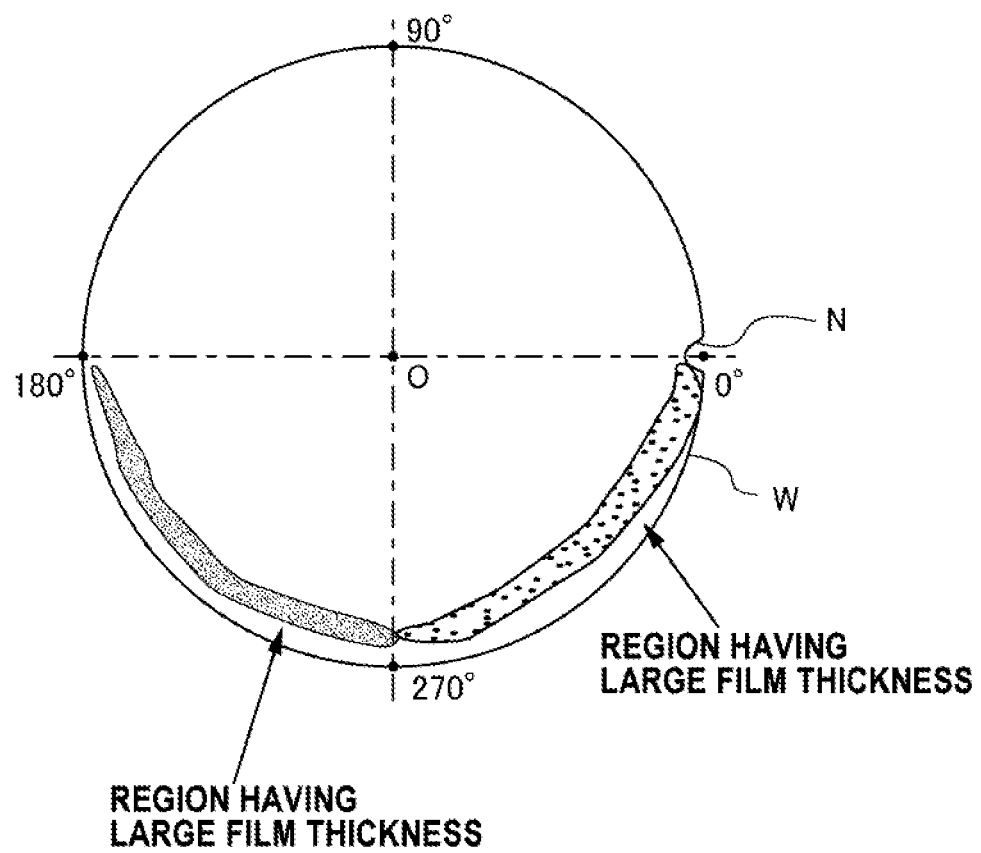
FIG. 16 is a diagram showing an example of a film-thickness distribution on a periphery of a substrate.
Figure 17:
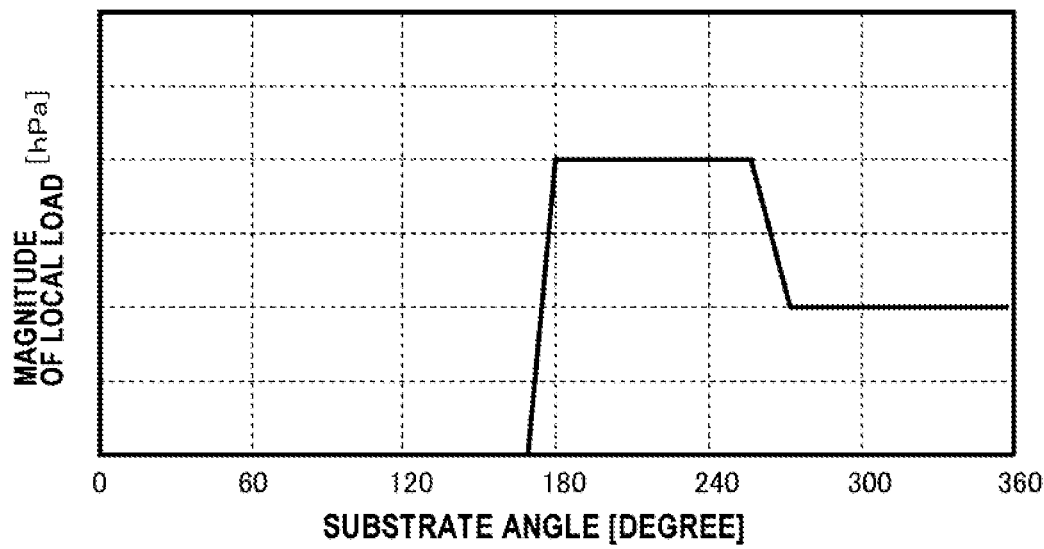
FIG. 17 is a graph showing a relationship between a magnitude of a local load and a substrate angle when the substrate shown in FIG. 16 is repair-polished.

FIG. 16 is a diagram showing an example of a film-thickness distribution in the periphery of the substrate W, and FIG. 17 is a graph showing a relationship between magnitude of the local load and substrate angle when the substrate W shown in FIG. 16 is repair-polished. As shown in FIG. 16, the substrate angle is defined as zero degree at the notch portion N. Vertical axis in FIG. 17 represents the magnitude of the local load generated by the local-load exerting device 30, and horizontal axis in FIG. 17 represents the substrate angle at the position receiving the local load.

In the example shown in FIG. 16, the film thickness is large in a region from about 180 degrees to about 350 degrees. The film thickness in a region from about 180 degrees to about 270 degrees is larger than the film thickness in a region from about 270 degrees to about 350 degrees. In this case, the operation controller 9 controls the local-load exerting device 30 in a manner as shown in FIG. 17. The operation controller 9 stops the operation of the local-load exerting device 30 in the region from the substrate angle of 0 degrees to about 180 degrees, and operates the local-load exerting device 30 while controlling the magnitude of the local load based on the film thickness of the substrate W in the region from about 180 degrees to about 360 degrees. This is a case using a characteristic of the local-load exerting device 30 that the polishing amount of the region to be polished increases as the load increases.

In one embodiment, the rotation speed of the polishing head 1 may be periodically changed in synchronization with the rotation angle of the polishing head 1. For example, the rotation speed of the polishing head 1 when the local-load exerting device 30 is generating the local load may be lower than the rotation speed of the polishing head 1 when the local-load exerting device 30 is not generating the local load. As a result, the substrate W can receive the local repulsive force for a longer time, and the polishing rate can be further increased. In one embodiment, when the polishing rate is to be lowered, the rotation speed of the polishing head 1 may be higher than the rotation speed of the polishing head 1 when the local-load exerting device 30 is generating the local load.

Further, in one embodiment, the rotation speed of the polishing head 1 may be changed periodically in synchronization with the rotation angle of the polishing head 1 without using the local-load exerting device 30, based on the measurement result of the film thicknesses of the periphery measured in the periphery film-thickness measuring process or the measurement result of the film thicknesses of the periphery measured by the stand-alone-type film-thickness measuring device. The polishing rate of the periphery is non-uniform with respect to the rotating direction of the polishing table 3, and the polishing rate may increase in a downstream side of the substrate W in the rotating direction of the polishing table 3. This is because a force is generated in a direction toward the polishing pad 2 (downward direction) in a portion where the substrate W is in contact with the retainer ring 60. Therefore, in this method, the periphery can be repair-polished only by the rotation speed of the polishing head 1 without using the local-load exerting device 30.

Specifically, when a portion having a large film thickness of the periphery of the substrate W (i.e., a portion at which the polishing rate of the substrate W is to be increased) is located at the downstream side in the rotating direction of the polishing table 3 (when the portion is in contact with the retainer ring 60 at the downstream side), the operation controller 9 instructs the polishing-head rotating motor 12 to lower the rotation speed of the polishing head 1 below a rotation speed when the portion having a large film thickness of the periphery of the substrate W is not located at the downstream side in the rotating direction of the polishing table 3 (when the portion is not in contact with the retainer ring 60 at the downstream side). In one embodiment, when a portion having a large film thickness of the periphery of the substrate W (i.e., a portion at which the polishing rate of the substrate W is to be increased) is not located at the downstream side in the rotating direction of the polishing table 3 (when the portion is not in contact with the retainer ring 60 at the downstream side), the operation controller 9 instructs the polishing-head rotating motor 12 to increase the rotation speed of the polishing head 1 beyond a rotation speed when the portion having a large film thickness of the periphery of the substrate W is located at the downstream side in the rotating direction of the polishing table 3 (when the portion is in contact with the retainer ring 60 at the downstream side).

Figure 18:
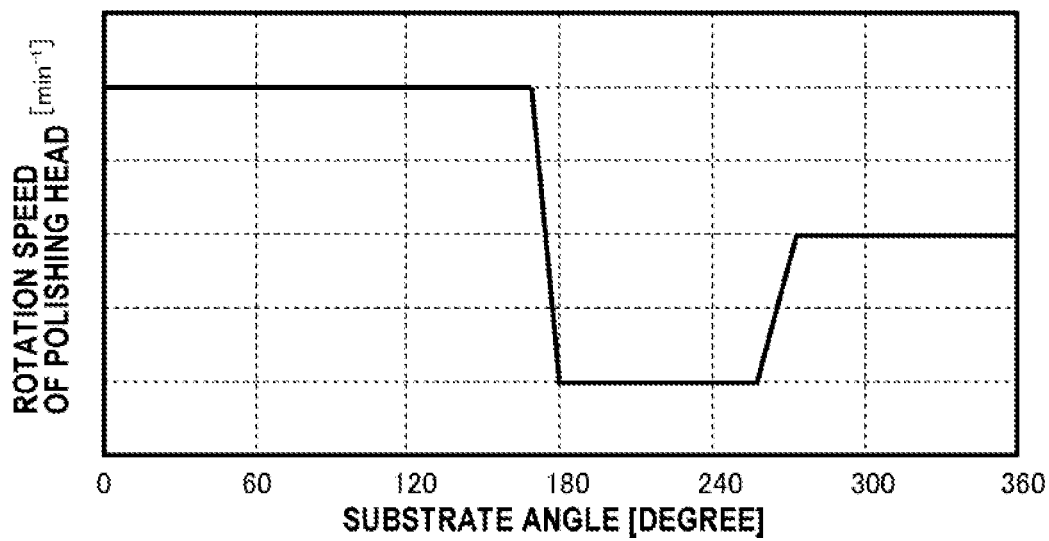
FIG. 18 is a graph showing a relationship between a rotation speed of a polishing head and the substrate angle when the substrate shown in FIG. 16 is repair-polished.

FIG. 18 is a graph showing a relationship between the rotation speed of the polishing head 1 and the substrate angle when the substrate W shown in FIG. 16 is repair-polished while periodically changing the rotation speed of the polishing head 1 in synchronization with the rotation angle of the polishing head 1. Horizontal axis of FIG. 17 represents the substrate angle at a position where the substrate W contacts the retainer ring 60 in the downstream side.

In this way, the local load on the retainer ring 40 or the rotation speed of the polishing head 1 is periodically changed (or varied) based on the measurement result of the film thicknesses of the periphery and in synchronization with the rotation angle of the polishing head 1. As a result, the variation in the film thickness of the periphery can be repaired (or corrected) and eliminated.

In step 11, while the substrate W is polished, the film-thickness index value of the substrate W is calculated in the same way as in the step 4, and the film-thickness index value and a polishing end point are compared. When the film-thickness index value has reached the polishing end point, the polishing is terminated. When the film-thickness index value does not reach the polishing end point, the process returns to the step 10.

The initial polishing process and the repair-polishing process may be performed in the same place or may be performed in different places.

Although the repair-polishing process is performed in order to eliminate the variation in the film thickness of the periphery of the substrate W, the central portion of the substrate W is also polished during the repair-polishing process. As a result, a target film-thickness profile may not be obtained. In such a case, the initial polishing process may be terminated before the film thickness of the central portion of the substrate W reaches a target film thickness, and in the repair-polishing process, the central portion of the substrate W may be further polished while the variation in the film thickness of the periphery of the substrate W is eliminated.

Further, in one embodiment, the above-described measuring of the film-thicknesses (the step 7 and the step 8) and the above-described repair-polishing may be applied not only to the periphery but also to any location, such as the central portion of the substrate W. Also in this case, the operation controller 9 instructs the film-thickness measuring device 40 to measure the film thicknesses of the substrate W (specifically, the film thicknesses of an arbitrary region of the substrate W), while rotating the polishing head 1 to rotate the substrate W on the polishing surface 2a and controlling the position of the film-thickness measuring device 40 (more specifically, the film-thickness sensor 41) relative to the polishing head 1. Further, in one embodiment, during measuring of the film thickness of the substrate W, the operation controller 9 may instruct the plurality of pressure regulators R2 to R5 to regulate the pressures in the pressure chambers 70 to 73 such that the polishing head 1 presses the substrate W against the polishing surface 2a. The operation controller 9 may instruct the plurality of pressure regulators R3 to R5 to regulate the pressures in the pressure chambers 71 to 73 such that the polishing head 1 presses the outer portion of the substrate W against the polishing surface 2a, while the operation controller 9 may instruct the switching valve 74 to provide a fluid communication between the gas delivery line F2 and the vacuum line V1 to attract the central portion of the substrate W.

As described above, in the present embodiment, the film thickness of the substrate W is measured while the position of the film-thickness measuring device 40 relative to the polishing head 1 is controlled. As a result, the accuracy of measuring the film thickness of the substrate W can be improved, and the film-thickness distribution of the substrate W can be determined accurately. After the film-thickness measuring process for the substrate W, i.e., the film-thickness measuring process of the arbitrary region on the substrate W, the repair-polishing process may be performed, so that the variation in the film thickness of the substrate W may be repaired or corrected based on the film thicknesses measured in the film-thickness measuring process for the substrate W.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A film-thickness measuring method for a substrate using a film-thickness measuring device, at least a part of the film-thickness measuring device being mounted to a polishing table that supports a polishing pad, said method comprising:

measuring film thicknesses of the substrate, while rotating the substrate on a polishing surface of the polishing pad by a polishing head and controlling a position of the film-thickness measuring device relative to the polishing head, wherein controlling the position of the film-thickness measuring device relative to the polishing head comprises controlling, in synchronization with the polishing head, at least one of an oscillating motor that oscillates the polishing head along the polishing surface and a table motor that rotates the polishing table.

2. The film-thickness measuring method according to claim 1, wherein during the measuring of the film thicknesses of the substrate, pressures in a plurality of pressure chambers formed by an elastic membrane of the polishing head are regulated such that the polishing head presses the substrate against the polishing surface.

3. The film-thickness measuring method according to claim 2, wherein the pressures in the plurality of pressure chambers are regulated such that an outer portion of the substrate is pressed against the polishing surface while a central portion of the substrate is attracted.

4. The film-thickness measuring method according to claim 1, wherein the film-thickness measuring device is an optical film-thickness measuring device or an eddy-current-type film-thickness measuring device.

5. The film-thickness measuring method according to claim 1, wherein an area where the film thicknesses are measured is a periphery of the substrate.

6. The film-thickness measuring method according to claim 5, wherein controlling the position of the film-thickness measuring device relative to the polishing head comprises controlling the position of the film-thickness measuring device relative to the polishing head based on a rotation angle of the polishing head such that a measuring position for the film thicknesses traces a path extending in a circumferential direction of the periphery.

7. The film-thickness measuring method according to claim 5, wherein:
controlling the position of the film-thickness measuring device relative to the polishing head comprises controlling the position of the film-thickness measuring device relative to the polishing head such that a measuring position for the film thicknesses moves in a radial direction of the substrate in a plurality of regions arranged in a circumferential direction of the substrate; and
the plurality of regions include at least the periphery of the substrate.

8. The film-thickness measuring method according to claim 5, wherein controlling the position of the film-thickness measuring device relative to the polishing head comprises controlling the position of the film-thickness measuring device relative to the polishing head such that a measuring position for the film thicknesses moves in a circumferential direction of the substrate while meandering in a region including at least the periphery of the substrate.

9. A method of detecting a notch portion, comprising:
measuring film thicknesses of a periphery of a substrate by using said method according to claim 5; and
determining a position of a notch portion of the substrate based on a measurement result of the film thicknesses.

10. A polishing method comprising:
polishing a substrate while rotating the substrate on a polishing surface of a polishing pad by a polishing head;
measuring a film thickness of the substrate by a film-thickness measuring device during the polishing of the substrate;
stopping the polishing of the substrate;
when a variation in film thickness of a periphery of the substrate is out of a reference range, measuring film thicknesses of the periphery of the substrate, while rotating the substrate on the polishing surface of the polishing pad by the polishing head and controlling a position of the film-thickness measuring device relative to the polishing head,
wherein controlling the position of the film-thickness measuring device relative to the polishing head comprises controlling, in synchronization with the polishing head, at least one of an oscillating motor that oscillates the polishing head along the polishing surface and a table motor that rotates the polishing table; and
re-polishing the substrate such that the variation of the film thicknesses of the periphery of the substrate is eliminated.

* * * * *